US010954695B2

(12) United States Patent
Anderson et al.

(10) Patent No.: US 10,954,695 B2
(45) Date of Patent: Mar. 23, 2021

(54) INTERLOCK FOR ENCLOSURES

(71) Applicant: Hoffman Enclosures, Inc., Anoka, MN (US)

(72) Inventors: William Anderson, Blane, MN (US); Kevin Roof, Minneapolis, MN (US); Krystal Jamison, Shoreview, MN (US); Alkhalil Alkindi, Minneapolis, MN (US); Taylor Farber, Inver Grove Heights, MN (US); Csaba Andrasfi, St. Paul, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 243 days.

(21) Appl. No.: 15/998,809

(22) Filed: Aug. 16, 2018

(65) Prior Publication Data
US 2019/0055752 A1    Feb. 21, 2019

Related U.S. Application Data

(60) Provisional application No. 62/546,451, filed on Aug. 16, 2017.

(51) Int. Cl.
*E05C 7/04*    (2006.01)
*E05B 63/18*    (2006.01)
(Continued)

(52) U.S. Cl.
CPC ............ *E05B 63/185* (2013.01); *E05B 65/02* (2013.01); *E05C 7/06* (2013.01); *E05C 9/006* (2013.01);
(Continued)

(58) Field of Classification Search
CPC ...... E05B 63/185; E05B 63/20; E05B 15/526; E05B 65/02; E05B 65/468; E05B 83/10;
(Continued)

(56) References Cited

U.S. PATENT DOCUMENTS

| 1,910,550 A | 5/1933 | Kaser |
| 1,955,525 A | 4/1934 | Bales |

(Continued)

FOREIGN PATENT DOCUMENTS

| EP | 2624386 | 7/2013 |
| JP | 2016140214 | 8/2016 |
| JP | 2016140217 A | 8/2016 |

*Primary Examiner* — Jerry E Redman
(74) *Attorney, Agent, or Firm* — Quarles & Brady LLP

(57) ABSTRACT

An interlock for an enclosure can include a primary door activator with an activator arm, a secondary door activator, and a rotatable arrangement that links the primary and secondary door activators. The activator arm can block a primary door of the enclosure from being closed when the activator arm is in an open configuration. The activator arm can be configured to rotate with the rotatable arrangement in a first direction towards the open configuration as the primary door is opened, and in a second direction away from the open configuration as the primary door is closed. The secondary door activator can be configured to engage the rotatable arrangement to prevent rotation of the rotatable arrangement when the secondary door is open, and to permit rotation of the rotatable arrangement when the secondary door is closed.

20 Claims, 28 Drawing Sheets

(51) Int. Cl.
    *E05B 65/02*     (2006.01)
    *H05K 5/02*     (2006.01)
    *E05C 9/00*     (2006.01)
    *E05C 9/08*     (2006.01)
    *E05C 7/06*     (2006.01)
    *H02B 1/00*     (2006.01)
    *H02B 1/38*     (2006.01)

(52) U.S. Cl.
    CPC ............... *E05C 9/08* (2013.01); *H02B 1/00* (2013.01); *H02B 1/38* (2013.01); *H05K 5/0221* (2013.01)

(58) Field of Classification Search
    CPC .. E05B 77/52; H02B 1/00; H02B 1/38; H05K 5/0221; E05C 9/006; E05C 9/08; E05C 7/06
    USPC .................................................... 49/366, 367
    See application file for complete search history.

(56) References Cited

U.S. PATENT DOCUMENTS

| | | |
|---|---|---|
| 2,259,722 A | 10/1941 | Bales |
| 2,320,849 A | 6/1943 | Claybourn et al. |
| 2,364,612 A | 12/1944 | Bales |
| 2,521,498 A | 9/1950 | Beymer et al. |
| 2,543,643 A | 2/1951 | Ryan et al. |
| 3,826,520 A | 7/1974 | Ross et al. |
| 3,882,291 A | 5/1975 | Chiboroski |
| 3,896,353 A | 7/1975 | Burton et al. |
| 4,429,492 A * | 2/1984 | Imhoff ............... E05F 5/12 16/82 |
| 4,949,505 A * | 8/1990 | Cohrs ............... E05F 5/12 49/367 |
| 4,967,512 A * | 11/1990 | Schroder ............... E05F 5/12 49/367 |
| 5,061,022 A * | 10/1991 | Meriwether ............ E05C 7/04 312/324 |
| 5,641,215 A | 6/1997 | Pochet |
| 5,944,397 A * | 8/1999 | Zeitler ............... E05B 65/0003 312/217 |
| 5,944,399 A * | 8/1999 | Gillispie ............... E05F 1/006 312/324 |
| 6,047,501 A | 4/2000 | Zeitler |
| 6,401,393 B2 * | 6/2002 | Juntunen ............... E05F 5/12 49/367 |
| 6,449,904 B1 * | 9/2002 | Paasonen ............... E05F 5/12 49/103 |
| 8,020,950 B2 | 9/2011 | Reuter et al. |
| 8,147,008 B2 | 4/2012 | Guebre-Tsadik et al. |
| 8,727,459 B2 | 5/2014 | Bernard et al. |
| 2001/0025450 A1 * | 10/2001 | Juntunen ............... E05F 5/12 49/103 |
| 2013/0200767 A1 | 8/2013 | Mueller et al. |
| 2017/0013732 A1 | 1/2017 | Kipfer |
| 2018/0258677 A1 * | 9/2018 | Bright ............... E05C 9/006 |
| 2019/0055752 A1 * | 2/2019 | Anderson ............... E05B 65/02 |

\* cited by examiner

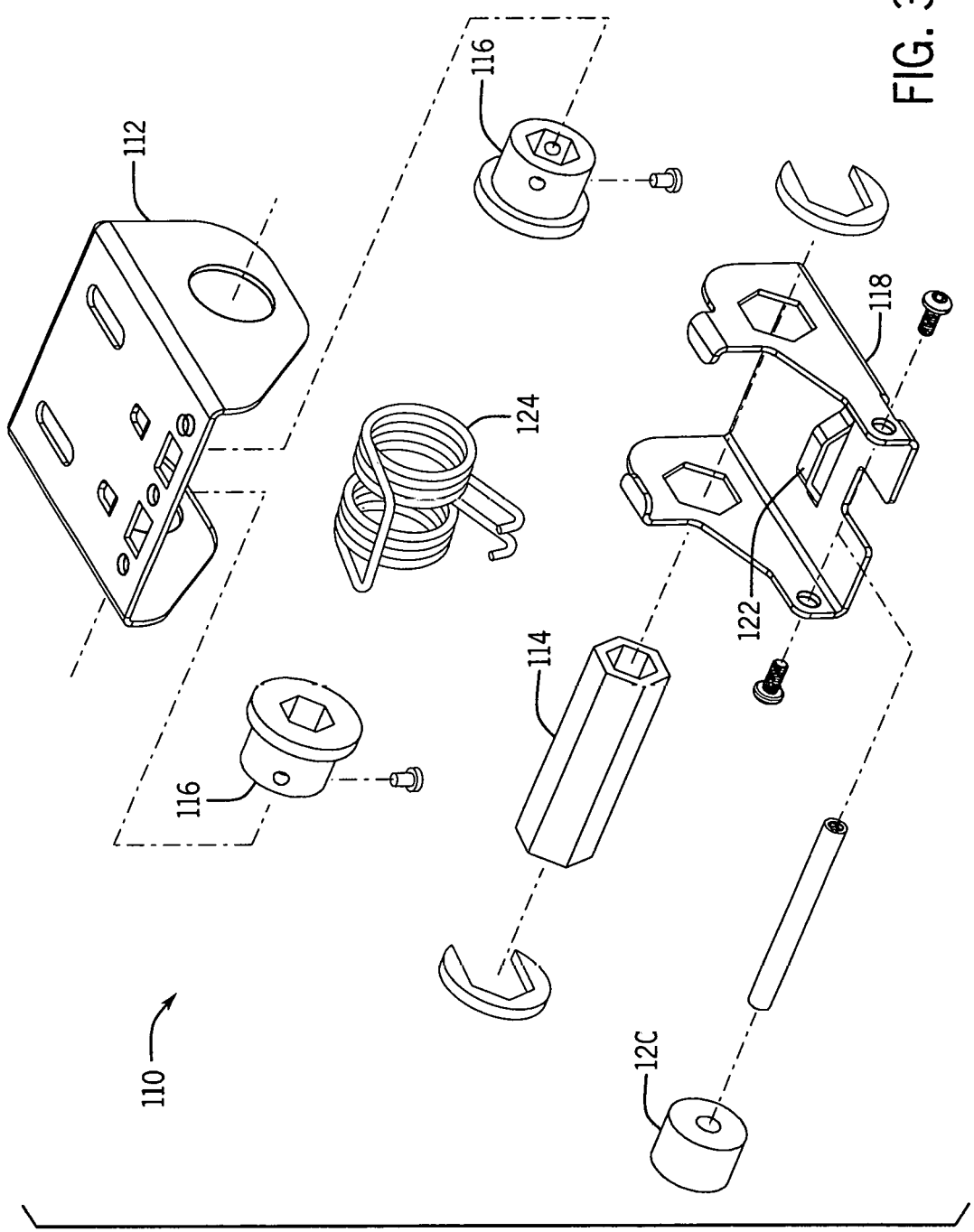

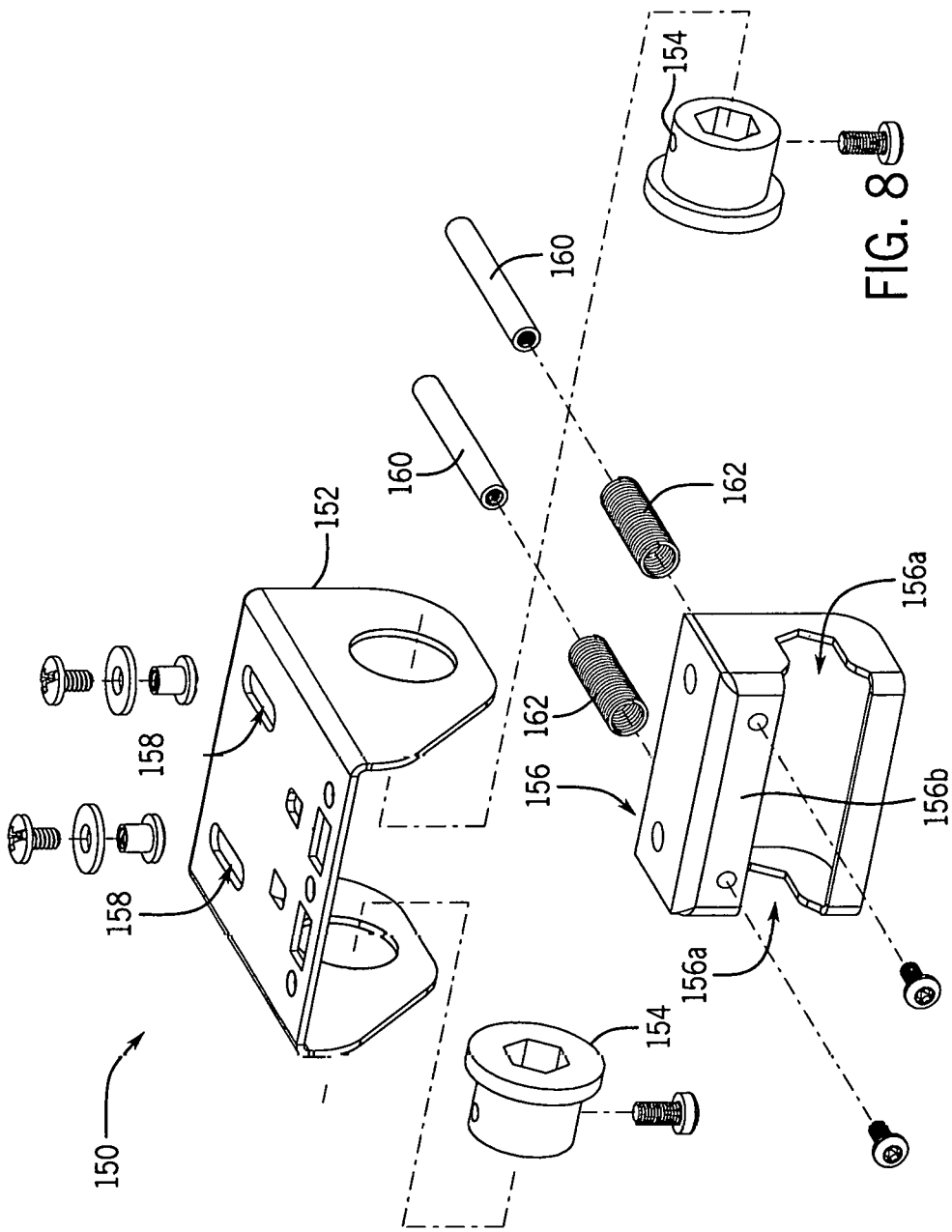

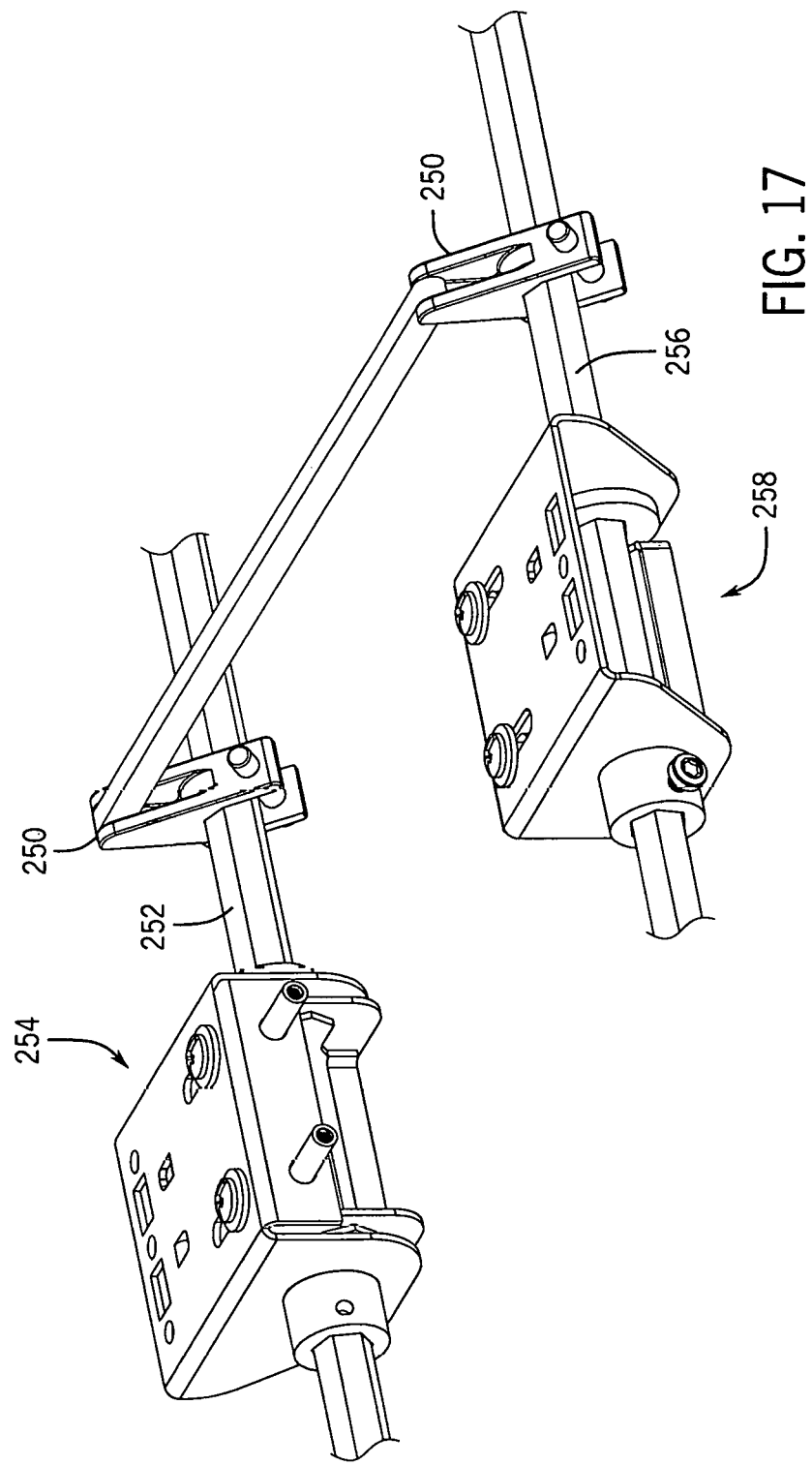

INTERLOCK FOR ENCLOSURES

RELATED APPLICATIONS

This application claims priority to U.S. Provisional Patent Application No. 62/546,451, titled "Interlock for Enclosures" and filed Aug. 16, 2017, the entirety of which is incorporated herein by reference.

BACKGROUND

Electrical equipment can be installed in enclosures with doors to allow users to access the equipment. In some installations, it may be useful to selectively prevent one or more doors from being opened, or to prevent certain doors from being closed before others. For example, in some installations, it may be useful to prevent a main door from being closed until secondary doors are also closed, or to prevent a main door from being opened unless power to the enclosure has been appropriately disconnected.

SUMMARY

Some embodiments of the invention provide an interlock for an enclosure, the enclosure including a frame, a primary door, and a secondary door. A primary door activator can be secured to the enclosure frame and can include a rotatable arm that is configured to rotate between an open configuration and a closed configuration. A rotatable rod assembly can be connected to, and configured to rotate with, the rotatable arm. A secondary door activator can include a jaw that is configured to move between an open configuration and a closed configuration. The rotatable arm, when in the open configuration, can be disposed to prevent the primary door from closing, and, when in the closed configuration, can be disposed to not prevent the primary door from closing. The jaw, when in the open configuration, can be disposed to engage the rotatable rod to prevent rotation of the rotatable rod assembly and the rotatable arm, and, when in the closed configuration, can be disposed to permit rotation of the rotatable rod assembly and the rotatable arm. The movable jaw can be disposed to be moved by the secondary door, from the closed configuration to the open configuration, when the secondary door is closed.

Some embodiments of the invention provide an interlock for an enclosure. A primary door activator can include an activator arm that can, in an open configuration, block a primary door of the enclosure from being closed when the activator arm. A rotatable arrangement can link the primary door activator to a secondary door activator. The activator arm can be configured to rotate with the rotatable arrangement in a first direction towards the open configuration as the primary door is opened, and in a second direction away from the open configuration as the primary door is closed. The secondary door activator can be configured to engage the rotatable arrangement to prevent rotation of the rotatable arrangement when the secondary door is open, and to permit rotation of the rotatable arrangement when the secondary door is closed.

Some embodiments of the invention provide an enclosure with a primary door, a secondary door, a primary door activator, a secondary door activator, and a rotatable arrangement that links the primary door activator and the secondary door activator. The primary door activator can include an activator arm that can be rotatable between an open configuration, in which the activator arm blocks the primary door from being closed, and a closed configuration, in which the activator arm permits the primary door to be closed. The jaw can be biased toward engagement with the rotatable arrangement. The rotatable arrangement can be configured to rotate with the activator arm and to be prevented from rotating when engaged by the jaw.

Some embodiments of the invention provide an interlock for an enclosure with a primary door and a secondary door. A primary door activator can include an activator arm that can block the primary door from being closed when the activator arm is in an open configuration. A secondary door activator can include a jaw. A rotatable arrangement can link the primary door activator to the secondary door activator. The activator arm of the primary door activator can be configured to rotate with the rotatable arrangement in a first direction towards the open configuration when the primary door is opened, and in a second direction away from the open configuration when the primary door is closed. The jaw of the secondary door activator can be configured to engage the rotatable arrangement to prevent rotation of the rotatable arrangement when the secondary door is open, and to permit rotation of the rotatable arrangement when the secondary door is closed, the secondary door activator thereby preventing rotation of activator arm when the secondary door is open.

Some embodiments of the invention provide an interlock for an enclosure with a primary door and a power disconnect that includes a biased latch actuator. A primary door activator can include an activator arm that is rotatable between an open configuration in which the activator arm blocks the primary door from being closed, and a closed configuration in which the activator arm permits the primary door to be closed. A rotatable arrangement can be configured to rotate with the activator arm. An interlock mechanism for the power disconnect can include a disconnect stop configured to be moved relative to the biased latch actuator by rotation of the rotatable arrangement, and a latch member configured to selectively latch the primary door. The interlock can be configured such that, with the power disconnect oriented to energize the enclosure, movement of the primary door from being closed towards being open rotates the rotatable arrangement to move the disconnect stop and thereby cause the biased latch actuator to pivot the latch member to latch the primary door. The interlock can be further configured such that, with the power disconnect oriented to de-energize the enclosure and with the primary door open, the disconnect stop is disposed to not block movement of the biased latch actuator, so that the power disconnect is prevented from energizing the enclosure.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 3 is an exploded isometric view of the primary interlock activator of FIGS. 2A and 2B;

FIG. 8 is an exploded isometric view of the secondary interlock activator of FIGS. 7A and 7B;

FIG. 17 is a isometric view of two interlock activators with rotatable rods, and a connecting device to link the rotatable rods, according to an embodiment of the invention;

DETAILED DESCRIPTION

Figure 1:
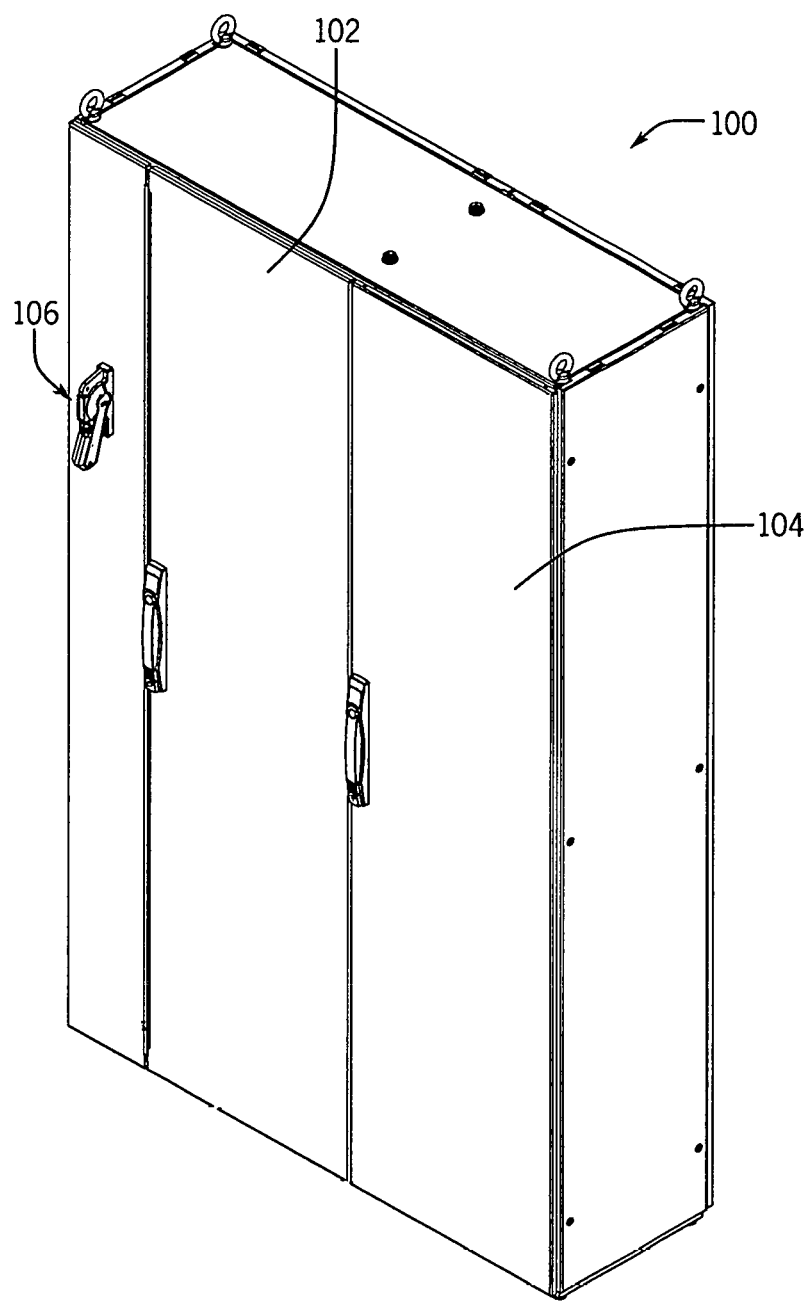
FIG. 1 is an isometric view of a multi-door enclosure for use with an interlock according to an embodiment of the invention.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Likewise, the phrases "at least one of A, B, and C," "one or more of A, B, and C," and the like, are meant to indicate A, or B, or C, or any combination of A, B, and/or C.

As used herein, unless specified or limited otherwise, the terms "mounted," "connected," "supported," and "coupled" and variations thereof are used broadly and encompass both direct and indirect mountings, connections, supports, and couplings. Further, "Connected" and "coupled" are not restricted to physical or mechanical connections or couplings.

Also as used herein, unless otherwise specified or limited, the terms "primary," "secondary," and the like are used for convenience to indicate functional or other relationships between different components of interlock systems. For example, "primary" features may be associated with one or more specific "primary" doors of an enclosure, while "secondary features" may be associated with one or more other "secondary" doors of the enclosure. However, the terms "primary" and "secondary" and the like do not necessarily require a particular relative importance of components, or a particular relative order of operations. For example, in some cases, "primary" features may be configured to be activated or deactivated first, and "secondary" features may be configured to be activated or deactivated second, during certain operations for an enclosure. In some cases, however, other associations or orders of activation or deactivation may be employed.

Also as used herein, unless otherwise specified of limited, "open configurations" and "closed configurations" do not necessarily describe configurations that require a particular component or collection of components to change in shape. For example, an open or closed configuration for an activator jaw or activator arm disclosed herein may correspond to a configuration of the activator jaw or activator arm when a corresponding door is open or closed, respectively, and not necessarily to a configuration in which the activator jaw or activator arm has changed shape to itself "open" or "close."

As noted above, it may sometimes be useful to link operation of different doors of an enclosure (e.g., of an electrical enclosure) so that one or more doors may (or may not) be opened or closed, depending on whether one or more other doors are currently open or closed. This may be useful, for example, in enclosures in which power is to be disconnected before operators conduct work within the enclosures. For example, in a multi-bay, multi-door enclosure, it may be useful to ensure that a main door (or other doors) cannot be opened while the enclosure is energized. Likewise, it may be useful to ensure that the main door (or other doors) cannot be closed unless one or more ancillary doors are also closed. This latter arrangement may be appropriate, for example, in order to ensure that all enclosure doors are closed before the enclosure is re-energized (e.g., via triggering of a power disconnect device).

Embodiments of the invention can provide these and/or other benefits. For example, some embodiments of the invention can include an interlock with at least one primary interlock activator for use with a primary door, and one or more secondary interlock activators for use with one or more secondary doors. Generally, the primary and secondary interlock activators can be interconnected with each other by a rotatable connection, such as one or more rotatable rods (e.g., in an extended rotatable rod assembly). The secondary interlock activators can prevent rotation of the rod(s), and thereby preventing the primary activator from permitting the primary door to close, unless each secondary door is closed.

In some embodiments, a rotatable connection between activators (e.g., as generally described above) can prevent one or more enclosure doors from opening unless a particular other door has been opened first. For example, one or more rotatable rods may be linked to latching devices, and an interlock activator (e.g., a primary interlock activator) may allow the rotatable rod(s) to rotate to unlatch the latching devices only when the corresponding door (e.g., a primary door) is open. In some embodiments, an interlock arrangement associated with a power disconnect can prevent a primary (or other) door from opening unless a power disconnect is in a disconnected or "off" position. Further, in some embodiments, primary and secondary interlock activators can cooperate to ensure that a particular door (e.g., a primary door) cannot be closed unless one or more other doors (e.g., secondary doors) have been closed first.

FIG. 1 illustrates an enclosure 100 that can be equipped with an interlock according to an embodiment of the invention. The enclosure 100 includes two bays, with respective primary and secondary doors 102, 104 to enclose the bays. A power disconnect 106 is provided to the left of the primary door 102, and can be pivoted upwards to energize the enclosure or downwards (as shown) to de-energize the enclosure.

The enclosure 100, like other enclosures and assemblies discussed herein, is presented as an example only. Interlocks according to different embodiments of the invention can be installed with any number of different enclosures and enclosure types, including enclosures with different numbers of bays or doors.

Figure 2A:
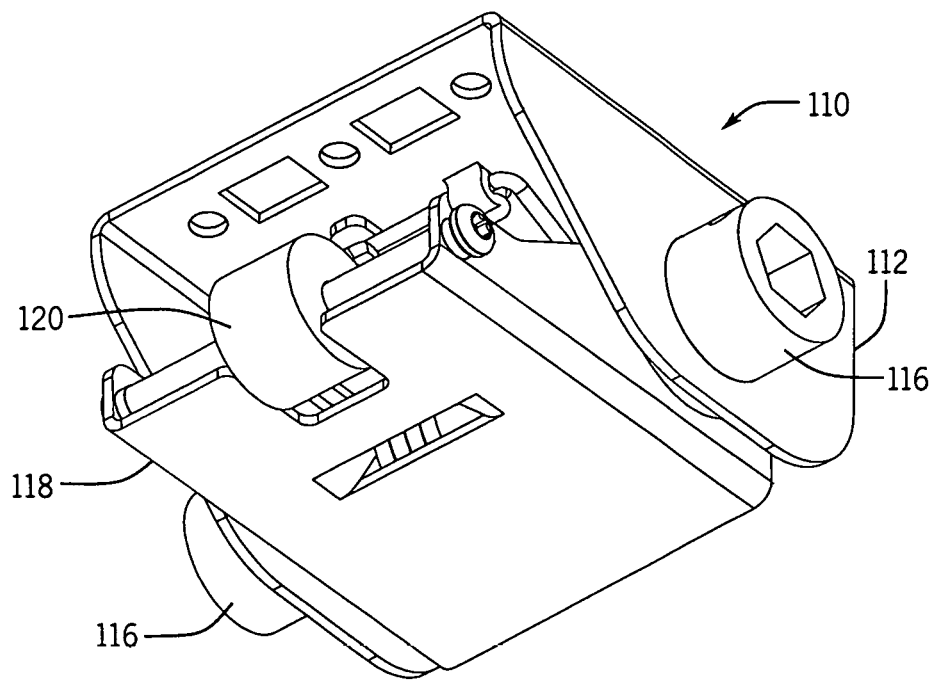
FIGS. 2A and 2B are isometric views of a primary interlock activator according to an embodiment of the invention.

FIGS. 2A through 3 illustrate a primary door activator ("PDA") 110 for an interlock according to one embodiment of the invention. Generally, the PDA 110 is configured to be installed for operation with a primary door of an enclosure (e.g., the primary door 102 of FIG. 1). In this regard, for example, the PDA 110 includes a chassis 112 configured to be secured to a frame of an enclosure proximate to a primary door.

The chassis 112 is also generally configured to rotatably receive part of a rotatable connection arrangement, such as a rotatable rod. For example, in the embodiment illustrated, the chassis 112 is configured to receive a hexagonal sleeve 114 (see FIG. 3) and a pair of hex-rod bushings 116, in order for a hexagonal rotatable rod (not shown in FIGS. 2A through 3) to be rotatably supported by the chassis 112.

In the embodiment illustrated, the sleeve 114 is configured as an integral component, such as may be formed by extrusion or through other processes. In some embodiments, a coupler for different parts of a rotatable arrangement (e.g., a rod coupler similar to the sleeve 114), or various other components of the invention, can be formed from multiple pieces. For example, in some embodiments, a sleeve similar to the sleeve 114 can be formed from two generally similar sheet metal pieces, which can be bolted together to secure multiple rods.

Figure 2B:
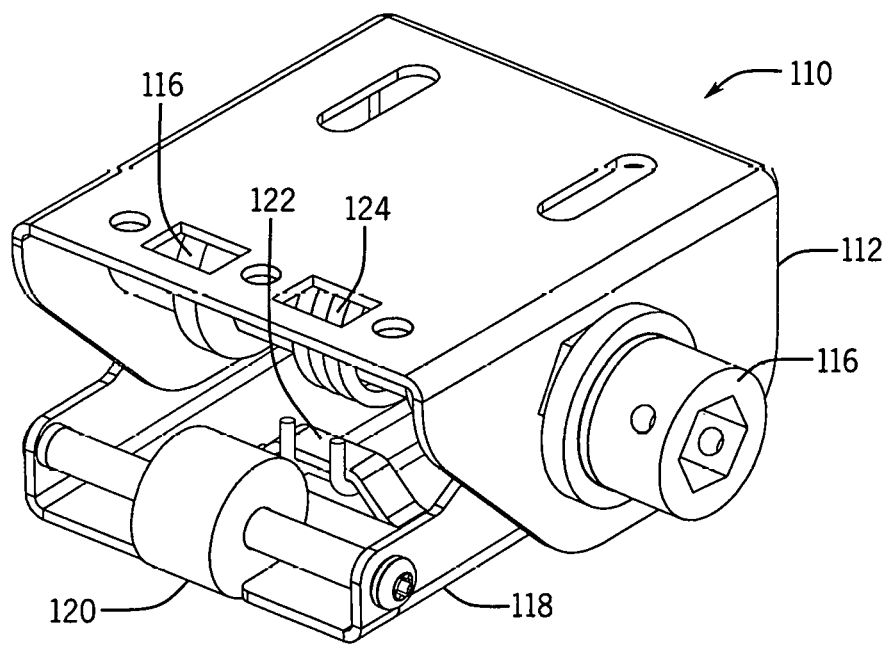

The PDA 110 also includes an activator arm 118, which is generally configured to rotate relative to the chassis 112 along with the relevant rotatable rod (and the sleeve 114). In the embodiment illustrated, for example, the activator arm 118 is formed as a stamped body with hexagonal through-holes on opposite side walls to receive the sleeve 114. Similarly, the activator arm 118 includes a rotating member 120 at a free end thereof, which extends beyond the chassis 112, as well as a spring seat 122. A biasing member, such as coil spring 124, can be engaged with the spring seat 122, to bias the activator arm 118 into an open configuration, as illustrated in FIGS. 2A and 2B.

Figure 4:
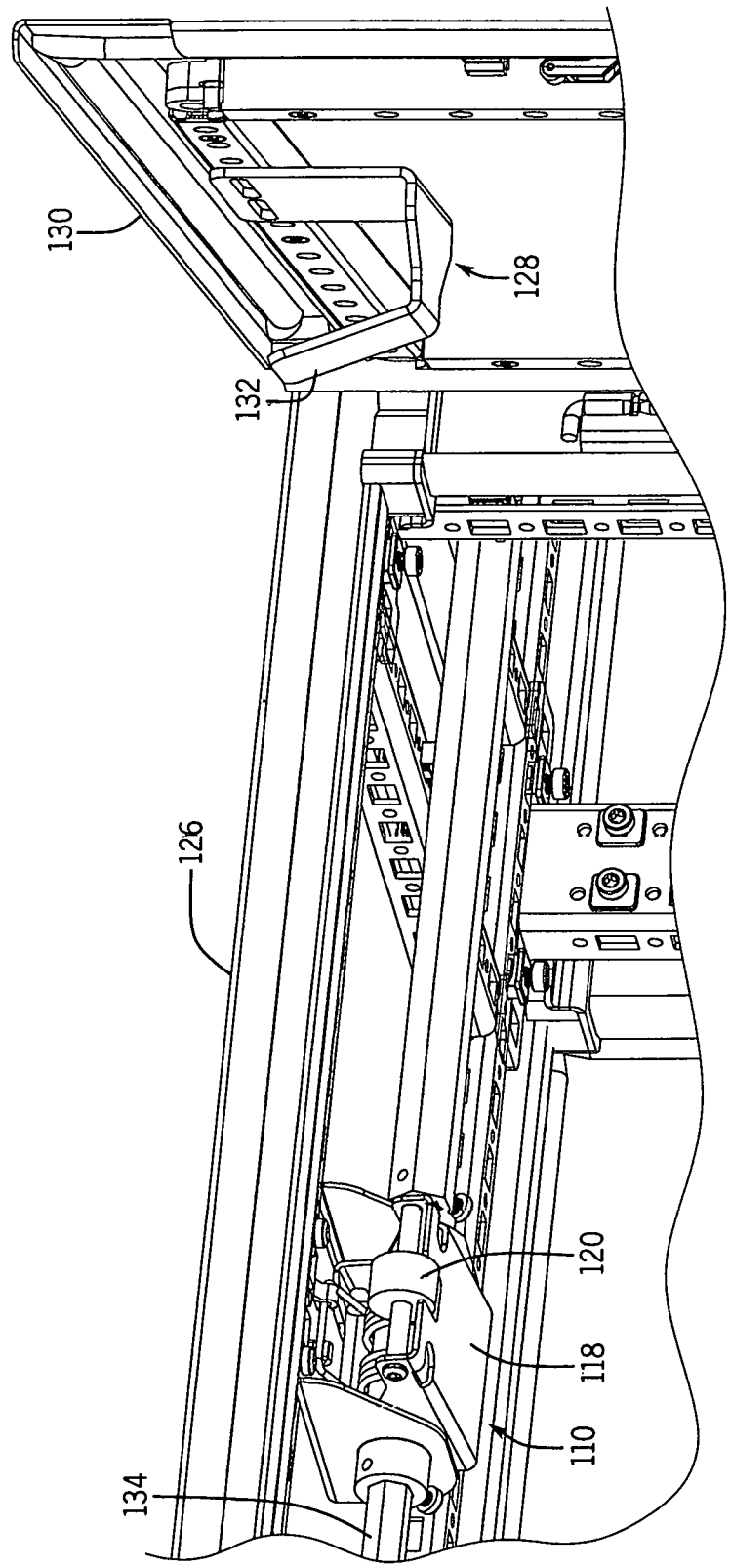
FIG. 4 is a isometric view of the primary interlock activator of FIGS. 2A and 2B, and an interlock stop according to an embodiment of the invention, arranged on a frame and a door of an enclosure, respectively.
Figure 5:
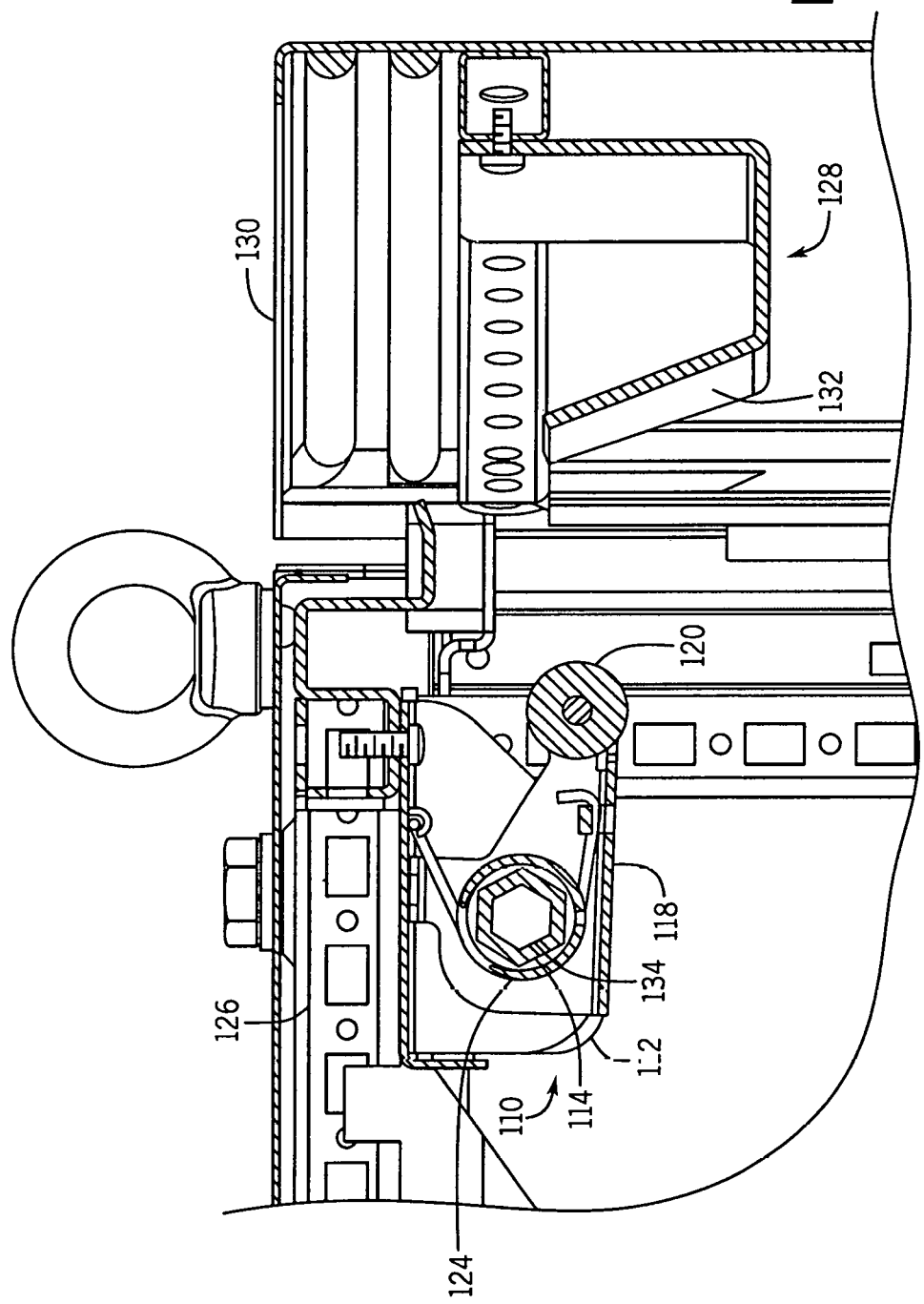
FIG. 5 is a side cross-sectional view of the arrangement of FIG. 4, with the primary interlock activator of FIGS. 2A and 2B in an open configuration.

The PDA 110 (as with other PDAs according to the invention) is generally configured for use with a semi-rigid stop, which can generally be secured to a relevant door of an enclosure in alignment with the rotating member 120 of the PDA 110. As illustrated in FIGS. 4 and 5, for example, the PDA 110 can be secured to a frame 126 of an enclosure with the rotating member 120 of the activator arm 118 extending, in the open configuration, into a door opening of the enclosure. Correspondingly, an interlock stop 128 can be secured to a door 130 of the enclosure, with an angled stop member 132 of the interlock stop 128 being disposed to contact the rotating member 120 of the PDA 110 as the door 130 is closed. A hex rod 134 can extend through the PDA 110 to connect the PDA 110 to other parts of the relevant interlock, as also described below.

Figure 6:
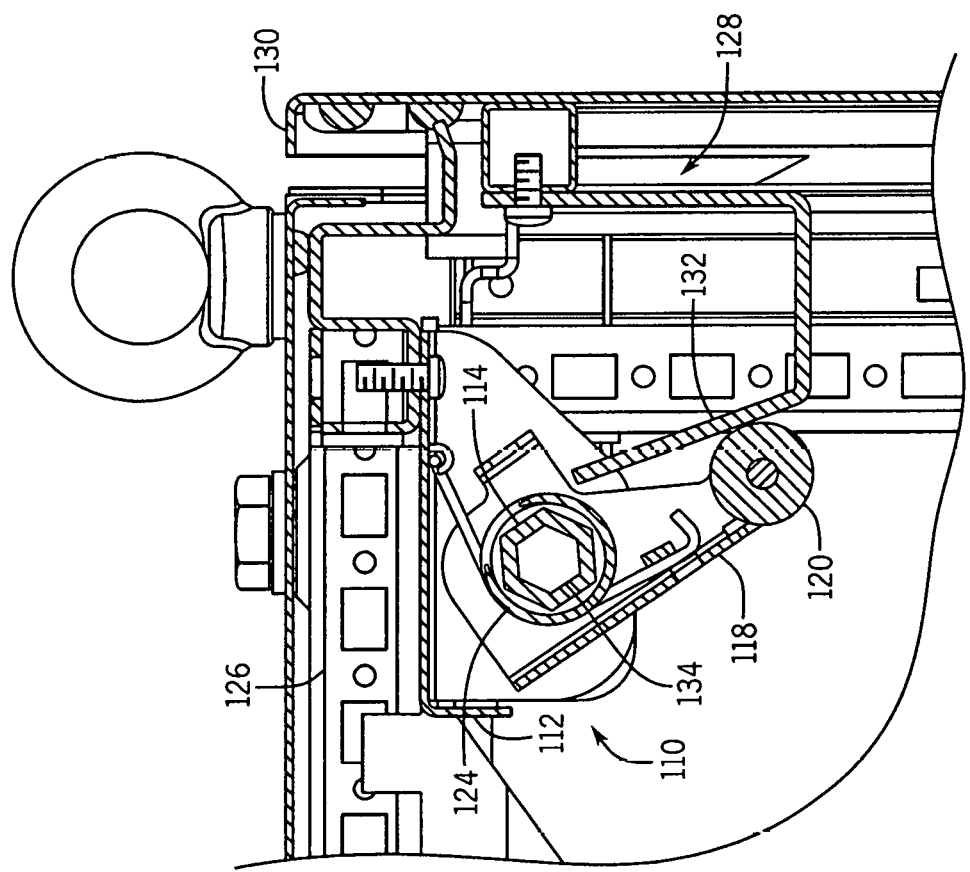
FIG. 6 is a side cross-sectional view of the arrangement of FIG. 4, with the primary interlock activator of FIGS. 2A and 2B in a closed configuration.

As illustrated in FIG. 6, for example, due to the non-vertical (e.g., angled) geometry of the stop member 132, as the door 130 is closed the interlock stop 128 generally urges the activator arm 118 to rotate downward (i.e., counter-clockwise from the perspective of FIG. 6) against the bias of the spring 124. As a result, if the hex rod 134 is free to rotate, the activator arm 118 can pivot out of the way of the interlock stop 128, so that the door 130 can be closed. Further, as the activator arm 118 rotates, the hex rod 134 is also rotated, which can transfer rotational motion to other parts of the interlock (as also discussed below).

In other embodiments, other configurations are possible. For example, an interlock stop can be configured to rotate an activator arm in a different direction than illustrated, as the relevant door is closed.

Usefully, if the hex rod 134 is prevented from rotating (e.g., as also discussed below), the activator arm 118 may also be prevented from rotating. Accordingly, if the hex rod 134 is not permitted to rotate, the activator arm 118 may be generally prevented from pivoting out of the way of the interlock stop 128. This may, correspondingly, effectively lock the PDA 110 in the open configuration of FIGS. 4 and 5. Therefore, for example, preventing the hex rod 134 from rotating can prevent the door 130 from being closed.

In the embodiment illustrated, the hex rod 134 is configured to rotate with the activator arm 118 due to a close securement of the hex rod 134 to the activator arm 118 via the hexagonal holes illustrated in FIG. 3A. In other embodiments, other configurations are possible.

Figure 7A:
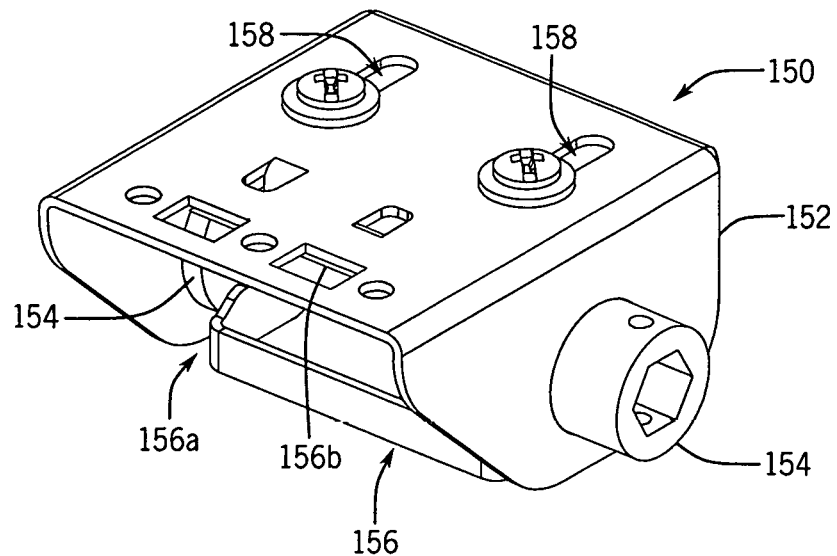
FIGS. 7A and 7B are isometric views of a secondary interlock activator according to an embodiment of the invention.

In some embodiments, a PDA can be configured to interoperate with one or more other interlock devices. FIGS. 7A through 8, for example, illustrate a secondary door activator ("SDA") 150 according to one embodiment of the invention, for use with the PDA 110 or other PDAs according to the invention. In some embodiments, as also discussed below, an SDA such as the SDA 150 can be configured to selectively prevent rotation of a rotatable connection associated with a PDA such as the SDA 150.

Generally, the SDA 150 is configured to be installed for operation with a secondary door of an enclosure (e.g., the secondary door 104 of FIG. 1). In this regard, for example, the SDA 150 includes a chassis 152 that is configured to be secured to a frame of an enclosure proximate to a secondary door.

The chassis 152 is also generally configured to rotatably receive a part of a rotatable connection, such as a rotatable rod. For example, in the embodiment illustrated, the chassis 152 is configured to receive a pair of hex-rod bushings 154, in order for a hexagonal rotatable rod (not shown in FIGS. 7A through 8) to be rotatably supported by the chassis 152. This may be useful, as also discussed below, to connect the SDA 150 to the PDA 110 using a common rotatable arrangement.

The SDA 150 also includes a movable jaw 156, which is generally configured to move translationally relative to the chassis 152 between open and closed configurations. For example, in the embodiment illustrated, the movable jaw 156 is secured to the chassis 152 at a set of elongate slots 158, so that translational movement of the jaw 156 can be generally defined (and limited) by the length of the slots 158. A set of guide members 160 (e.g., metal posts) are also provided (e.g., secured to the jaw 156), in order to also help to guide movement of the jaw 156 relative to the chassis 152.

Figure 7B:
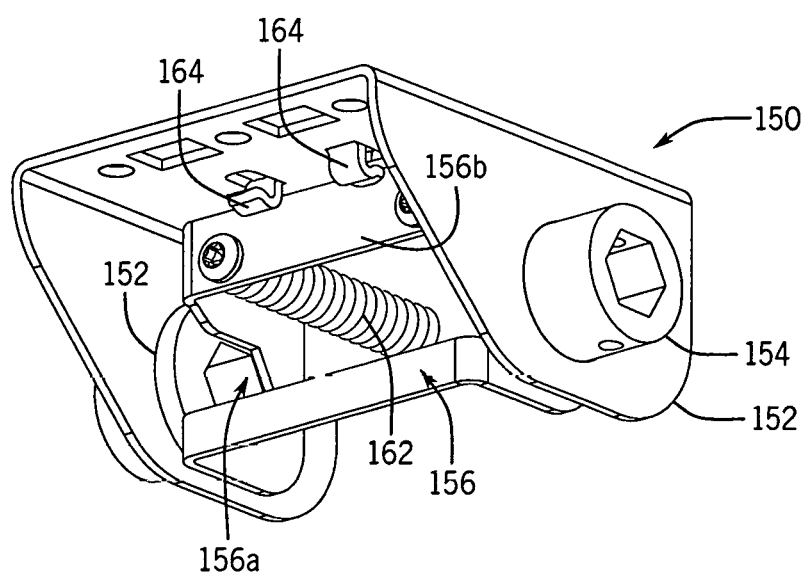

In some embodiments, it may be useful to bias a jaw towards an open configuration, which may correspond to a bias of the relevant jaw towards a front end of an associated chassis (e.g., towards an associated secondary door, or to the left, generally, from the perspectives of FIGS. 7A and 7B). In the embodiment illustrated, a biasing member configured as a coil spring 162 is provided on each of the guide members 160, with one end of each of the coil springs 162 engaging a back wall of the chassis 152 (engagement not shown in FIGS. 7A through 8). Accordingly, as the jaw 156 is translated towards the back wall of the chassis 152, the springs 162 can compress, thereby increasingly urging the jaw 156 to translate in the opposite direction—i.e., towards the front of the chassis 152. In the embodiment illustrated, a set of stops 164 are formed into the chassis 152 (see FIG. 7B), in order to also limit forward translation of the jaw 156.

As also discussed below, the jaw 156 is generally configured to engage a rotatable member, such as a rotatable rod associated with the SDA 150 (e.g., a hexagonal rod), in order to prevent the member from rotating when the jaw 156 is an open configuration, and to release the member for rotation when the jaw 156 is in a closed configuration. In the embodiment illustrated, the jaw 156 includes a set of partial hexagonal cut-outs 156a that is sized to complement, and generally aligned with, a hexagonal rod received through the bushings 154 on the chassis 152. In other embodiments, other configurations are possible, including configurations that may not necessarily surround a rotatable member similarly to the cut-outs 156a.

In some embodiments, other features can be included. For example, the jaw 156 also includes a contact feature configured as a generally planar contact face 156b.

Figure 9:
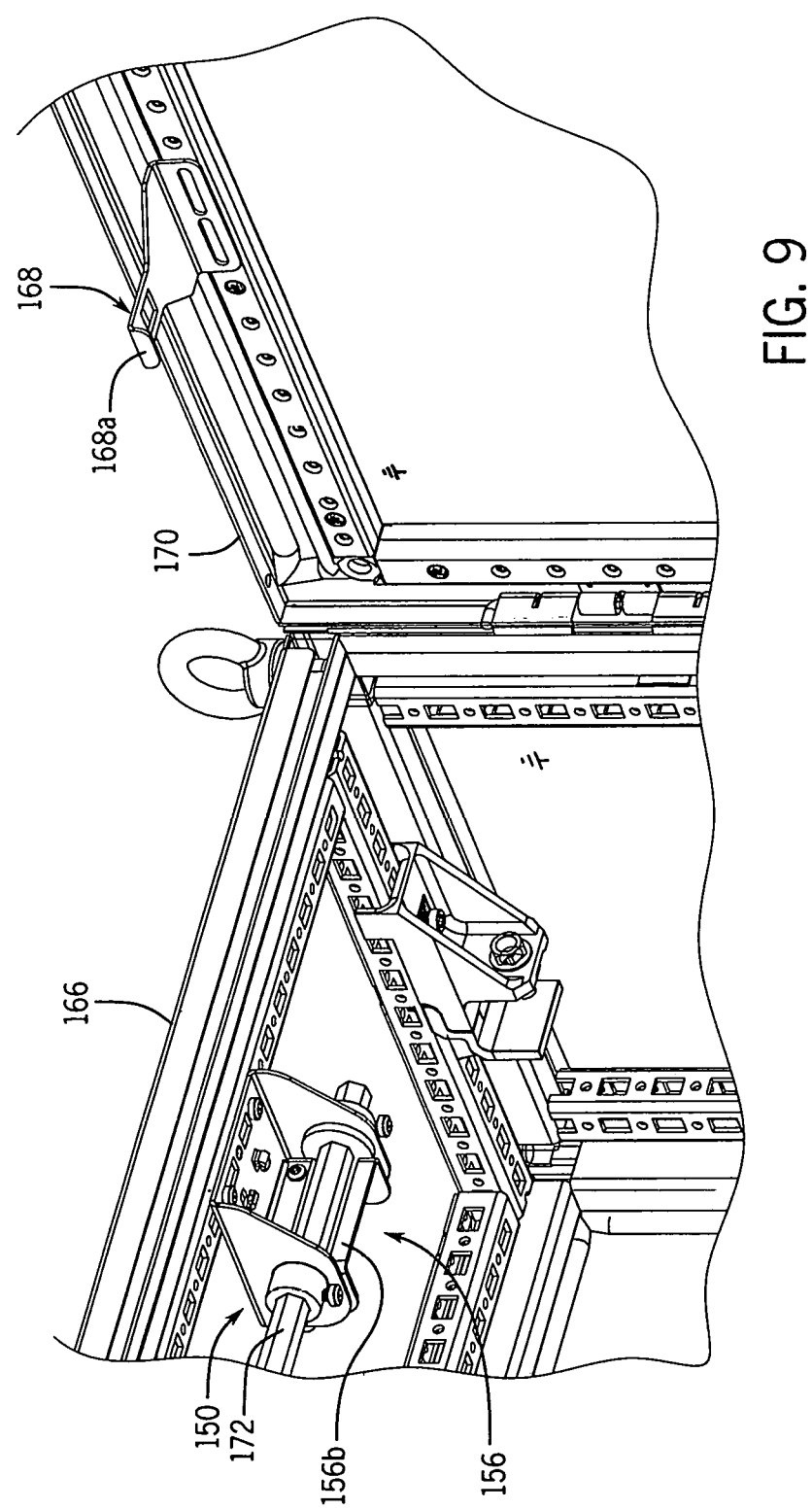
FIG. 9 is a isometric view of the secondary interlock activator of FIGS. 7A and 7B and another interlock stop according to an embodiment of the invention, arranged on a frame and a door of an enclosure, respectively.
Figure 10:
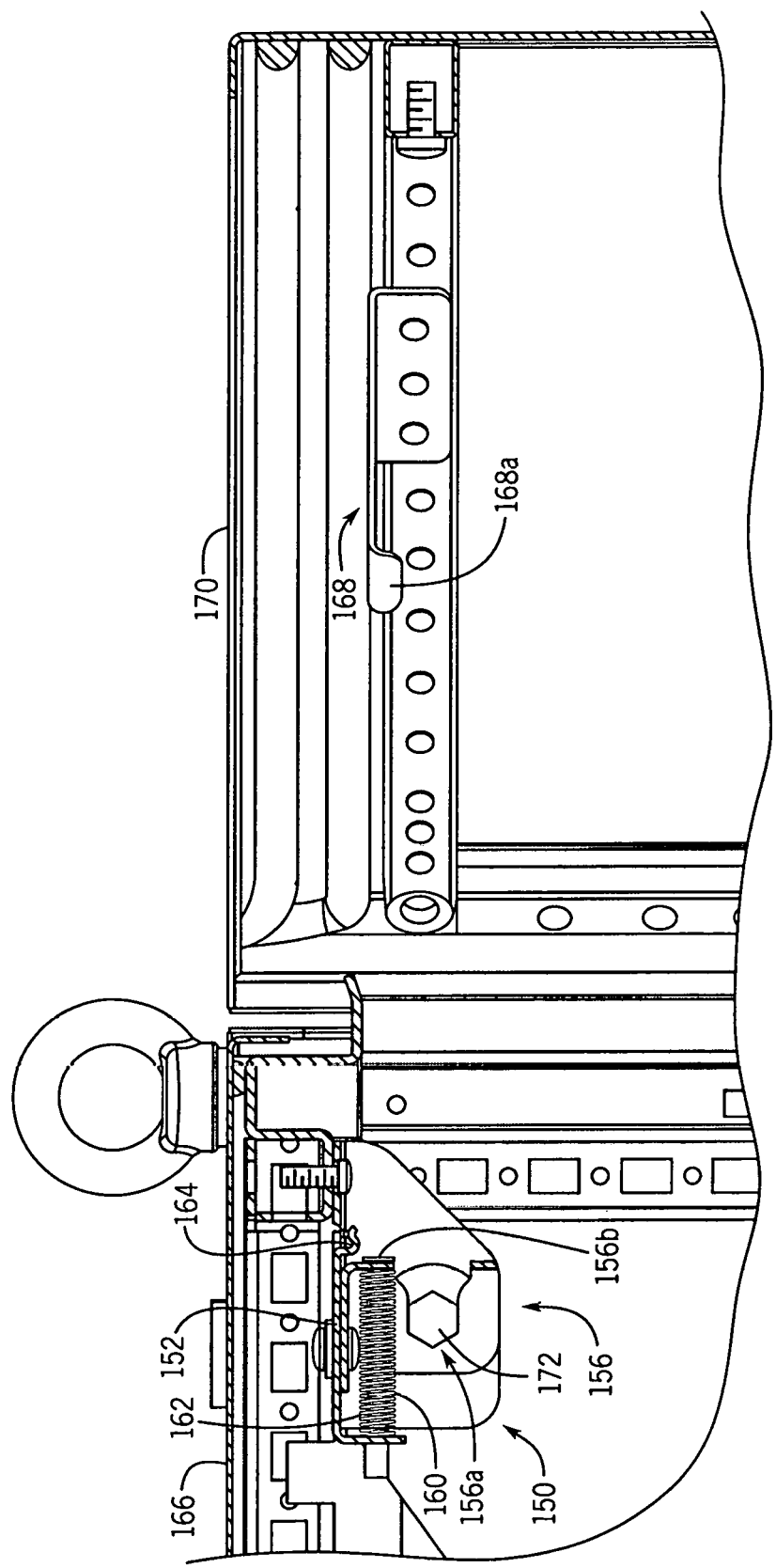
FIG. 10 is a side cross-sectional view of the arrangement of FIG. 9, with the secondary interlock activator of FIGS. 7A and 7B in an open configuration.

The SDA 150 (as with other SDAs according to the invention) is generally configured for use with a relatively rigid stop, which can be secured to a relevant door of an enclosure in alignment with the contact face 156b of the SDA 150. As illustrated in FIGS. 9 and 10, for example, the SDA 150 can be secured to a frame 166 of an enclosure in general alignment with a door opening of the enclosure. Correspondingly, an interlock stop 168 can be secured to a door 170 of the enclosure, with a stop portion 168a of the interlock stop 168 being disposed to contact the contact face 156b of the jaw 156 of the SDA 150 as the door 170 is closed. In this way, for example, the interlock stop 168 can move the SDA 150 (or allow the SDA 150 to move) between open and closed configurations depending on the orientation of the door 170.

In some configurations, the SDA 150 can prevent rotation of an associate rotatable assembly when the door 170 is open. As illustrated in FIG. 10, for example, when the SDA 150 (and the jaw 156) is in the open configuration, the jaw 156 is biased forward by the springs 162 (i.e., to the left, as shown) so that the cut-out 156a engages a hexagonal rod 172 supported by the chassis 152. Due to the relatively close fit between the rod 172 and the cut-out 156a, the rod 172 can thus be prevented from rotating as long as the SDA 150 remains in the open configuration.

Figure 11:
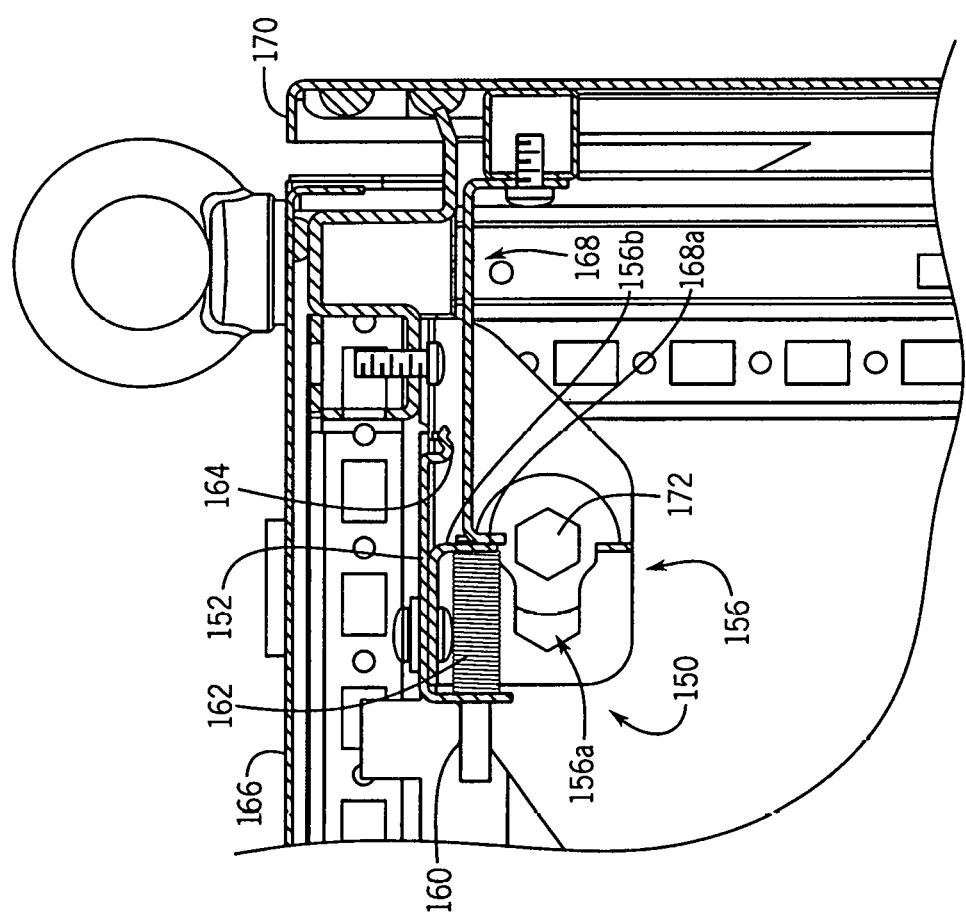
FIG. 11 is a side cross-sectional view of the arrangement of FIG. 9, with the secondary interlock activator of FIGS. 7A and 7B in a closed configuration.

In contrast, as illustrated in FIG. 11, when the door 170 is closed, the stop portion 168a of the stop 168 can engage contact face 156b of the jaw 156 to translate the jaw 156 towards the rear of the chassis 152 (i.e., to the right, as shown). Accordingly, when the door 170 is closed, the jaw 156 is moved out of engagement with the rod 172 and rotation of the rod 172 is no longer prevented by the jaw 156. When the door 170 is then re-opened, the biasing force of the springs 162 returns the jaw 156 to the open configuration, so that the cut-out 156a again engages the rod 172 to prevent the rod 172 from rotating.

Figure 12:
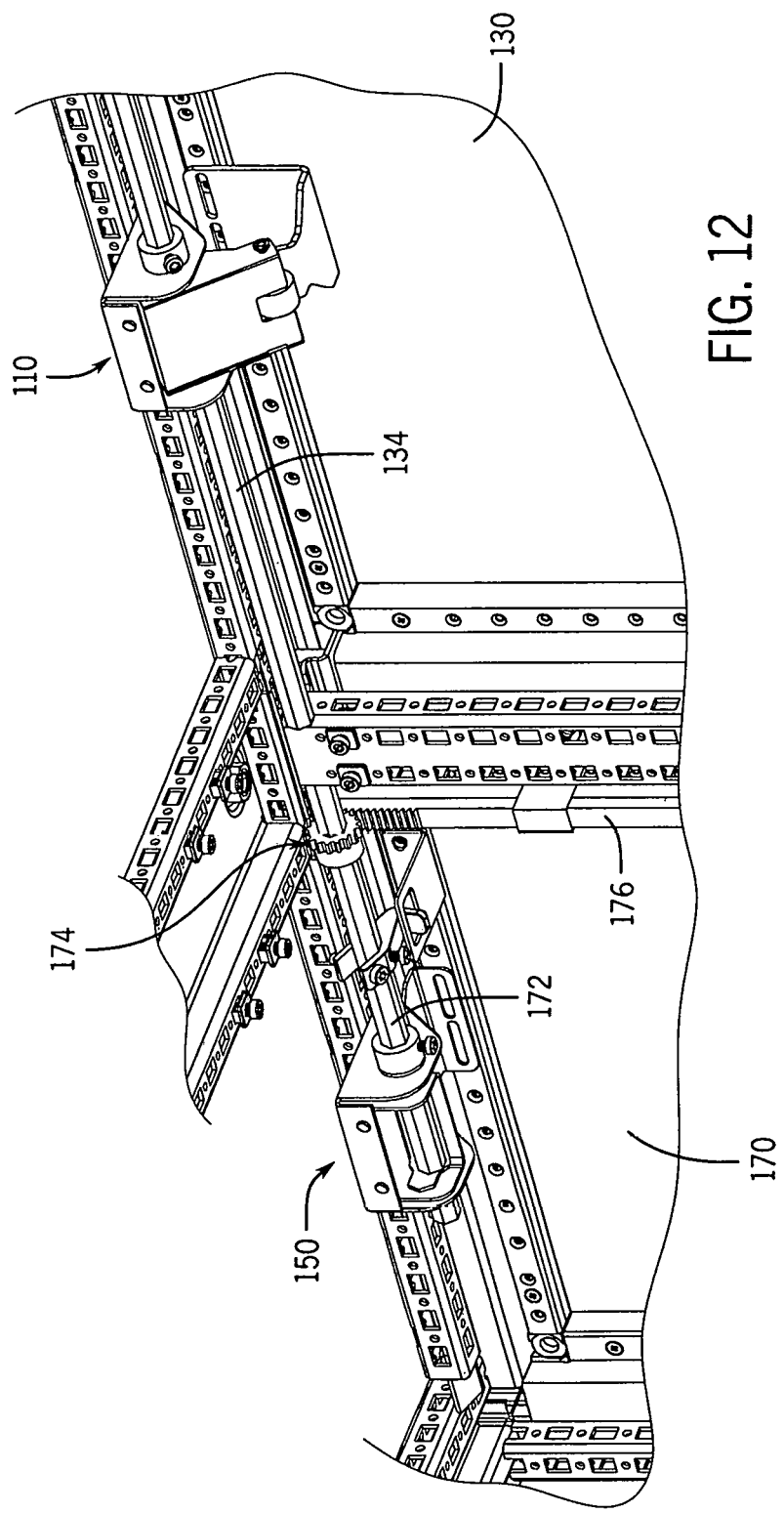
FIGS. 12 through 15 are isometric views of arrangements of the primary and secondary interlock activators in different enclosures, according to embodiments of the invention.

In some embodiments, the SDA 150 and the PDA 110 (or other sets of SDAs and PDAs) can be installed for use together in a larger interlock arrangement. As illustrated in FIG. 12, for example, the PDA 110 and the SDA 150 can be installed for use on the same enclosure, with the rods 134 and 172 (see also FIGS. 4 and 9, respectively) forming part of an extended rotatable-rod arrangement for the enclosure.

With the illustrated arrangement, for example, rotation of the rod 172 at the SDA 150 may effectively require simultaneous rotation of the hex rod 134 at the PDA 110. As such, for example, when the door 170 is opened and the SDA 150 moves to the open configuration (see FIG. 10), the prevention of the rotation of the rod 172 by the jaw 156 can also prevent the activator arm 118 of the PDA 110 from rotating into its closed configuration (see FIG. 6). In this way, for example, as long as the door 170 remains open and the jaw 156 is maintained in the open configuration, interference between the activator arm 118 and the interlock stop 128 may prevent the door 130 from closing. This may be useful, for example, in order to ensure that the door 170 (and any other secondary doors) are closed before the door 130 is closed and a power disconnect is disengaged.

In different embodiments, rotating rods can be linked together for co-rotation in different ways. In some embodiments, for example, the rods 134, 172 can be secured to rotate together using a hexagonal sleeve coupler. In other embodiments, as also discussed below, other configurations are possible.

The rod arrangements illustrated in FIGS. 9 and 12 are presented as examples only. In other embodiments, other configurations are possible. In some embodiments; for example, a single rotatable rod (e.g., a single hexagonal rod) can extend into engagement with a PDA and one or more SDAs, or a variety of other rotational assemblies can be used. In some embodiments, a rotatable rod (or other) arrangement can pass through structures not illustrated in FIG. 12, such as voltage barriers or other walls that may separate different enclosure bays. For example, a small-clearance bore can be extended through a particular voltage barrier (not shown) to allow a rotatable arrangement of an interlock to pass through the voltage barrier without otherwise compromising the integrity of the barrier.

Figure 13:
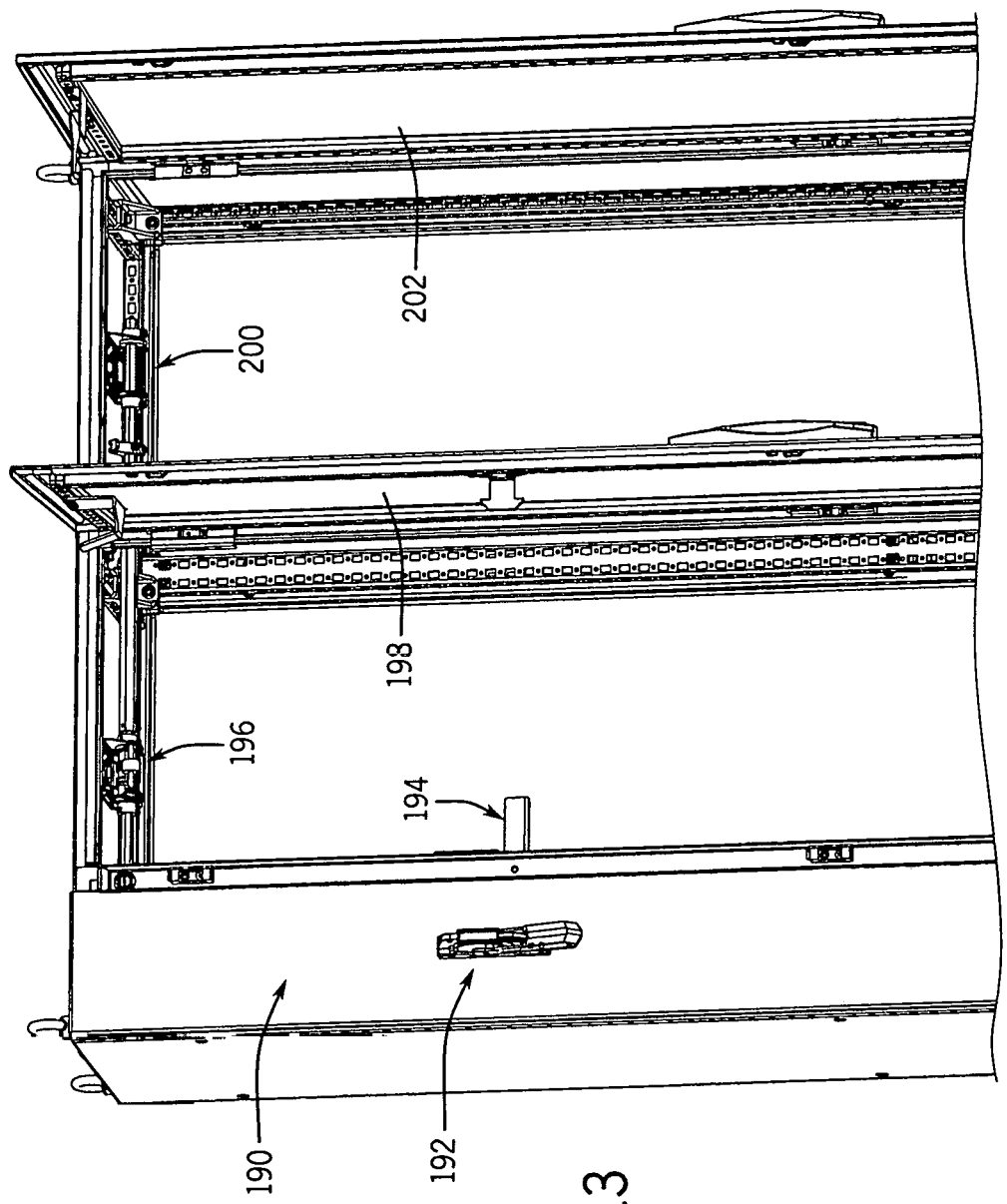

In other embodiments, other configurations are possible. For example, in different embodiments, one or more SDAs can be arranged to either side of a PDA, and a PDA and one or more SDAs can be arranged to either side of a power disconnect (or other device). As illustrated in FIG. 13, for example, an interlock 190 can generally include a power disconnect 192 and an associated interlock mechanism 194 (only partially shown), a PDA 196 for a primary door 198 to the right of the power disconnect 192, and an SDA 200 for a secondary door 202 to the right of the PDA 196. With this arrangement, for example, the interlock mechanism 194 can prevent opening of the primary door 198 unless the power disconnect 192 has de-energized the enclosure. Further, a latching device (not shown) can prevent opening of the secondary door 202 unless the primary door 198 is open (and, correspondingly, the PDA 196 is in the open configuration), and the PDA 196 and the SDA 200 can together prevent the primary door 198 from being closed (e.g., so that the enclosure can be re-energized) unless the secondary door 202 is closed first.

Figure 14:
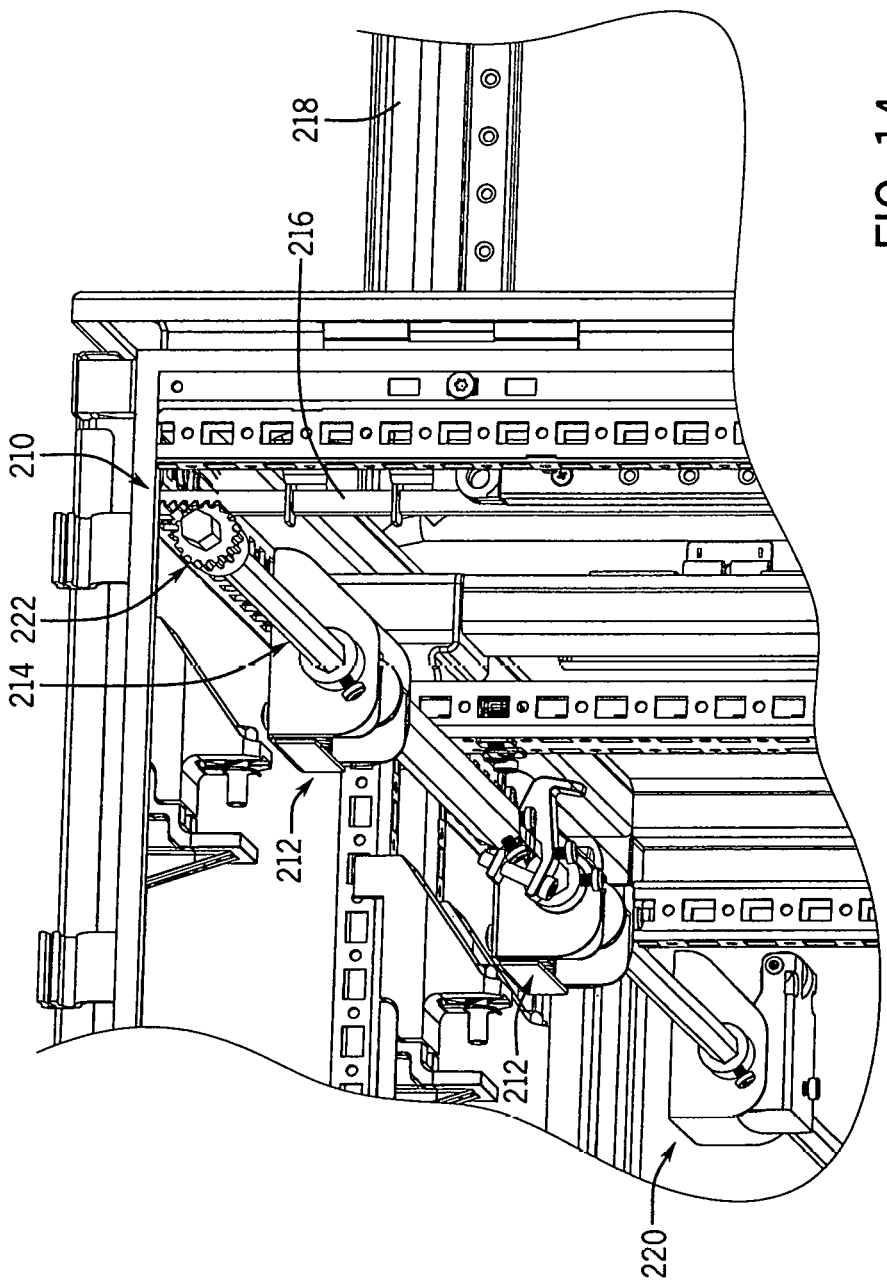

In some arrangements, multiple SDAs can be used with multiple secondary doors. In this way, for example, respective jaws of each of the SDAs can cooperate with one or more rotatable members of a common rotatable arrangement in order to prevent a PDA from allowing a primary door to close while any one of the secondary doors is open. As illustrated in FIG. 14, for example, an interlock 210 can include a pair of SDAs 212 configured to engage a common, extended rotatable rod arrangement 214. Generally, the rotatable rod arrangement 214 extends between the SDAs 212, as well as to a set of latch rods 216 (only one shown) for two secondary doors 218 (only one shown), and to a PDA 220 associated with a primary door (not shown). With this configuration, as also noted above, opening the primary door can allow the spring-biased PDA 220 to rotate the rod arrangement 214. This, in turn, via a gear arrangement 222 (or other mechanism), can unlatch the secondary doors 218.

With the illustrated arrangement, for example, opening the secondary doors 218 may be generally prevented until after opening the primary door (e.g., as may be permitted only after the enclosure is de-energized). Further, while the secondary doors 218 are open, each of the SDAs 212 may prevent further rotation of the rod arrangement 214 (e.g., as described above for the SDA 150). As similarly described above, this may correspondingly prevent rotation of an activator arm of the PDA 220, and thereby prevent the primary door from being closed as long as either of the secondary doors 218 remains open.

Figure 15:
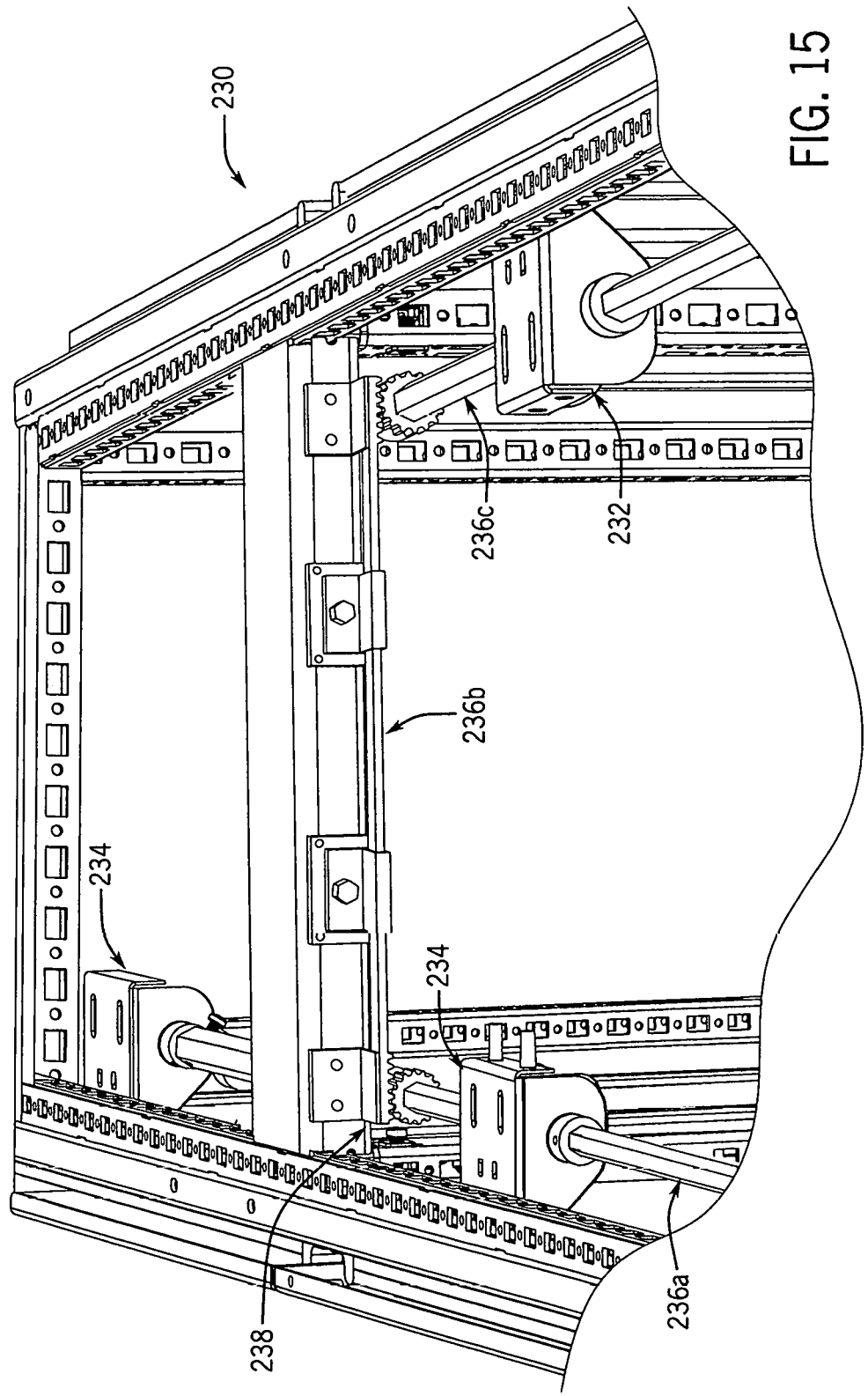

In some embodiments, interlock activators can be disposed on different (e.g., opposite) sides of an enclosure. As illustrated in FIG. 15, for example, an interlock 230 includes a PDA (not shown) and two SDAs 234 arranged along a front-side portion 236a of a rotatable rod arrangement (e.g., similarly to the configuration of FIG. 14). Further, through a set of gear arrangements 238 and a transitional portion 236b of the rod arrangement, the interlock 230 extends across the enclosure to a rear-side portion 236c of the rod arrangement, which is engaged with a third SDA 232. In this way, for example, interlock functionality (e.g., similar to that described for FIG. 14) can be extended to both front and rear doors of an enclosure.

In the embodiment illustrated, each of the gear arrangements 238 includes a pinion gear and a worm gear that are intermeshed with each other and co-rotate with respective associated rods. In other embodiments, other configurations are possible, including to transfer rotation for a rotatable arrangement to different sides of an enclosure. For example, in some embodiments, non-geared arrangements can be used, such as described below with regard to FIG. 17.

Figure 16B:
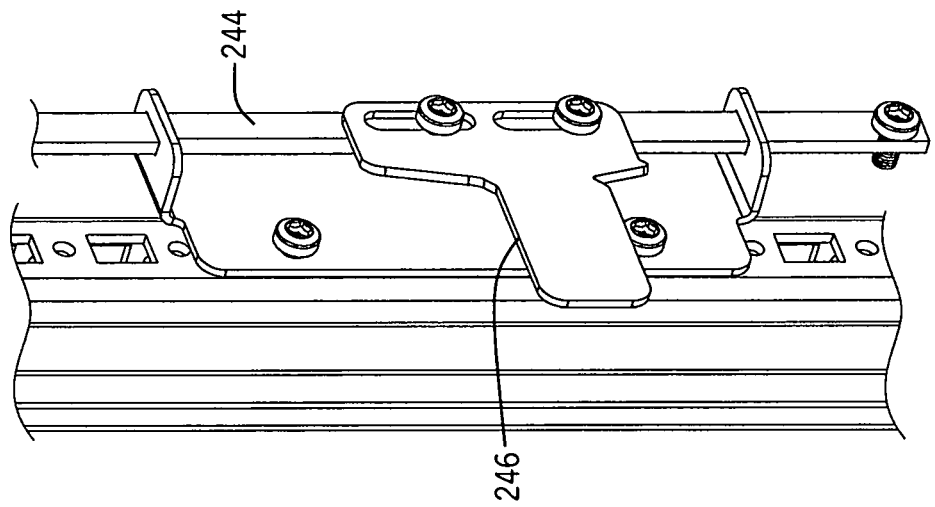
FIGS. 16A and 16B are isometric views, respectively, of an interface between a secondary interlock activator and an upper end of a latching device, and of a lower end of the latching device, according to an embodiment of the invention.
Figure 16A:
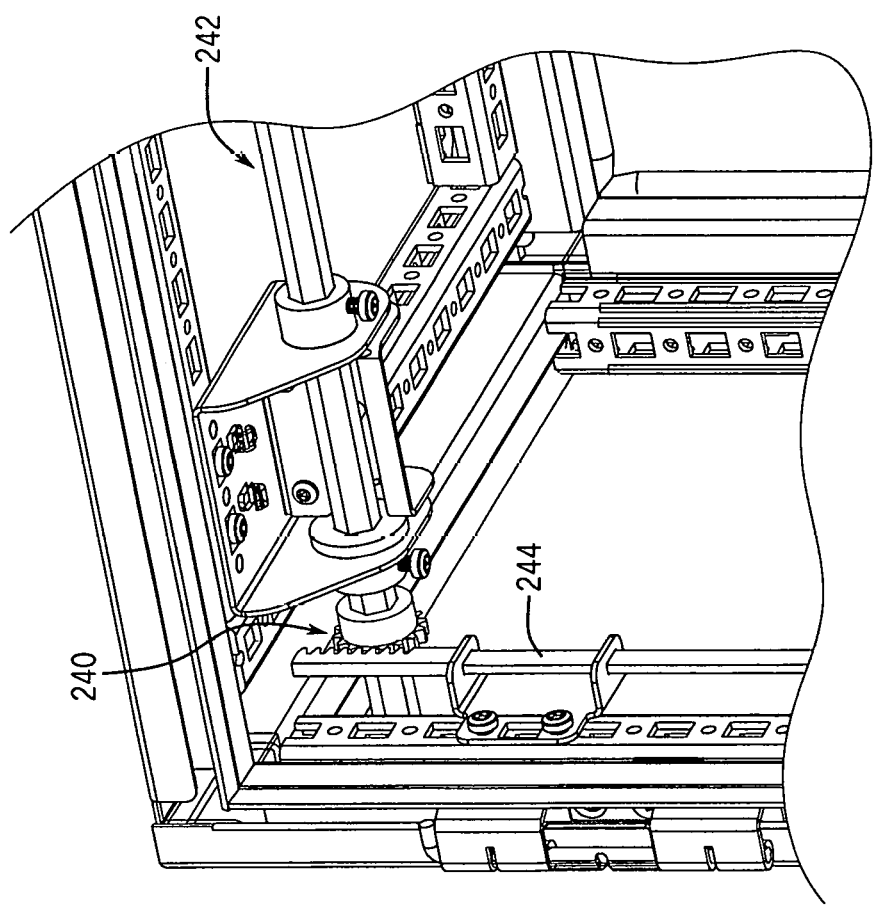

As also noted above, in some embodiments, it may be useful to include a latching device in a particular interlock. In some embodiments, as also discussed above, a latching device can be activated via a gear arrangement. As illustrated in FIGS. 16A and 16B, for example, an interlock can include a rack and pinion arrangement 240 to convert rotational movement of a rotatable rod arrangement 242 into translational movement of a latch member 244. As illustrated in FIG. 16B in particular, the latch member 244 can include a catch 246 that can move into or out of engagement with a corresponding structure on a door (not shown) in order to latch or unlatch the door based on the rotation of the rod arrangement 242.

In some embodiments, a cam arrangement can be used to transmit rotational movement between portions of a rotatable rod arrangement (or other interlock components). For example, as illustrated in FIG. 17, a set of cam brackets 250 (or other cams) can be configured to convert rotation of a first rod 252 associated with a first door activator 254 (e.g., an SDA) into rotation of a second rod 256 associated with a second door activator 258 (e.g., another SDA).

Figure 18:
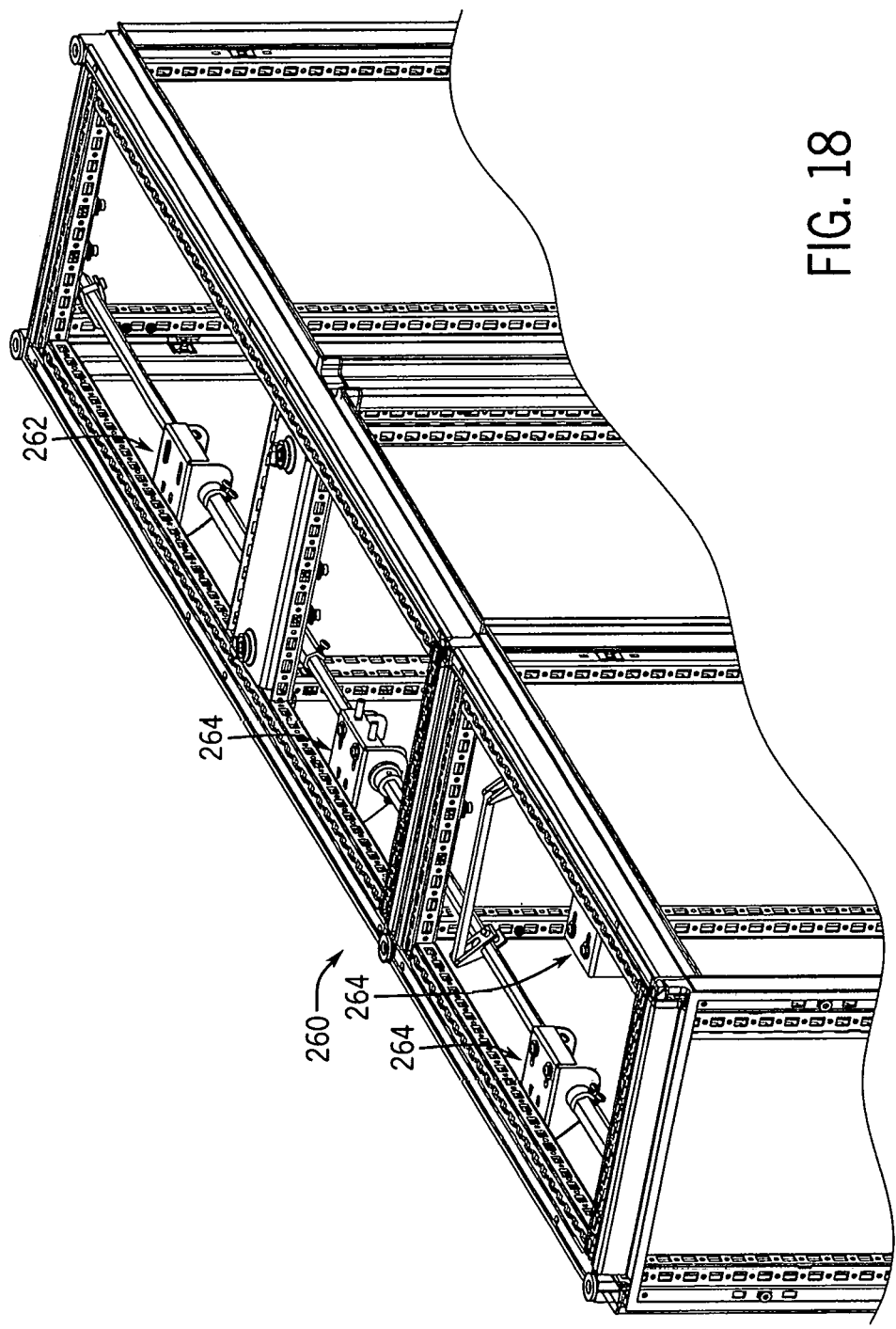
FIG. 18 is a isometric view of a multi-door enclosure and interlock according to an embodiment of the invention, with certain exterior panels of the enclosure removed.

FIG. 18 illustrates an example of an interlock for an enclosure 260 that employs a similar cam arrangement as is shown in FIG. 17 to link a PDA 262 and a two SDAs 264 to a third SDA 264. Usefully, as illustrated in FIG. 18, a cam assembly linking rotatable rods on opposite sides of the enclosure 260 can transmit rotation between the rotatable rods despite a barrier being disposed in the relevant enclosure bay. In the illustrated embodiment, the cam assembly passes above the barrier. In other embodiments, other configurations are possible.

Figure 19A:
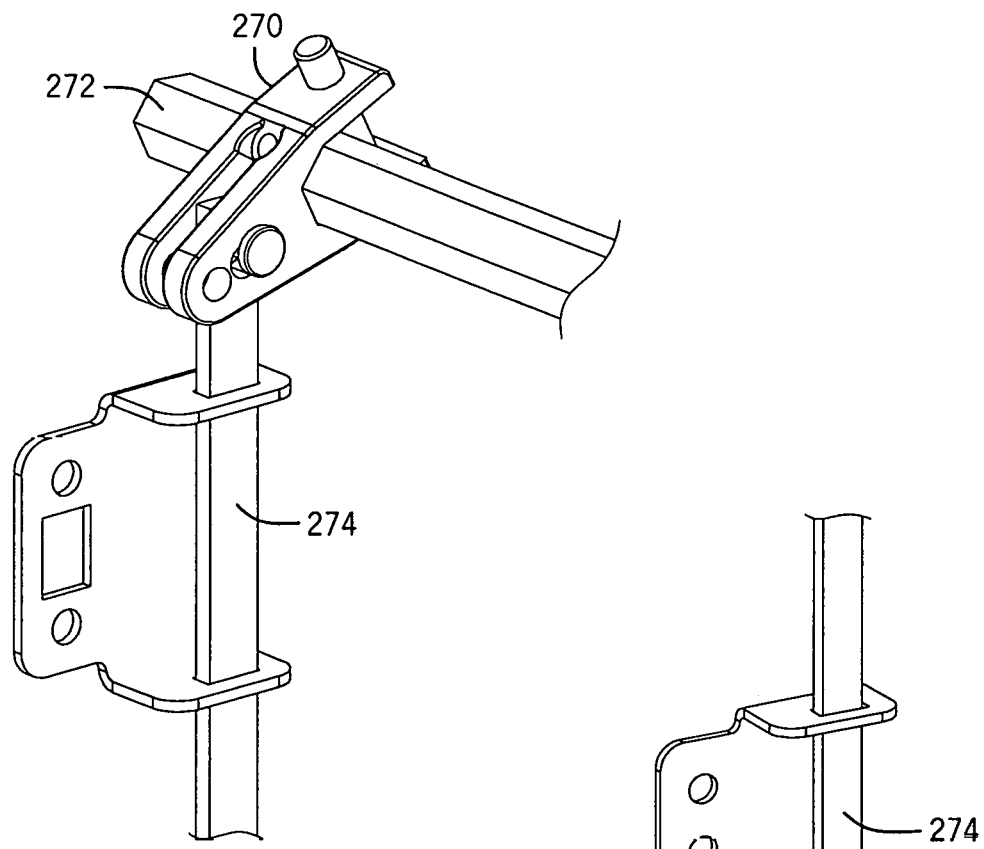
FIGS. 19A and 19B are isometric views, respectively, of an interface between a rotatable rod and an upper end of a latching device, and of a lower end of the latching device, according to an embodiment of the invention.
Figure 19B:
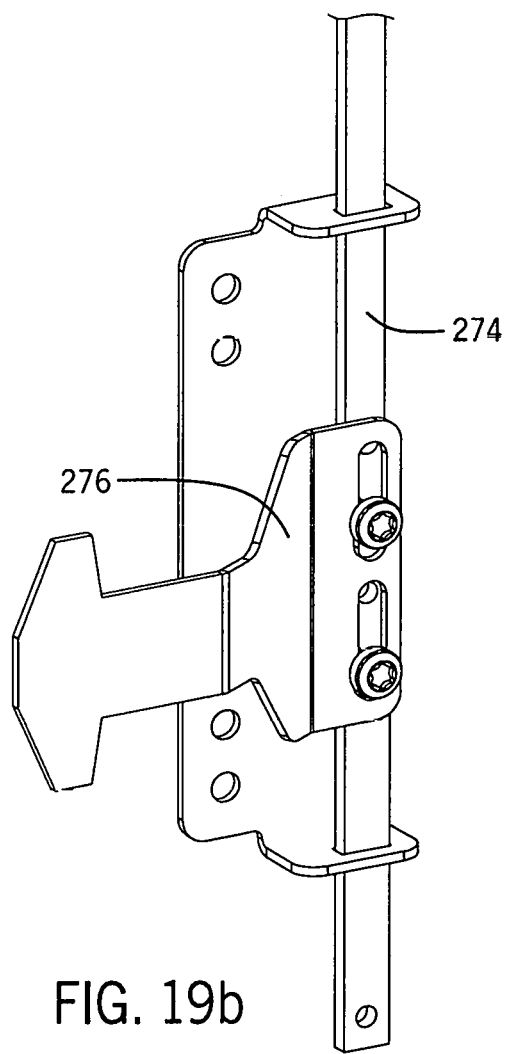

In some embodiments, a cam can also be used to activate a latching (or other) device based on rotation of a rotatable rod or other rotatable member. For example, as illustrated in FIGS. 19A and 19B, a cam bracket 270 can convert rotational movement of a rod 272 that is engaged with one or more door activators (not shown) into translational movement of a latch member 274 and an associated catch 276.

Figure 20:
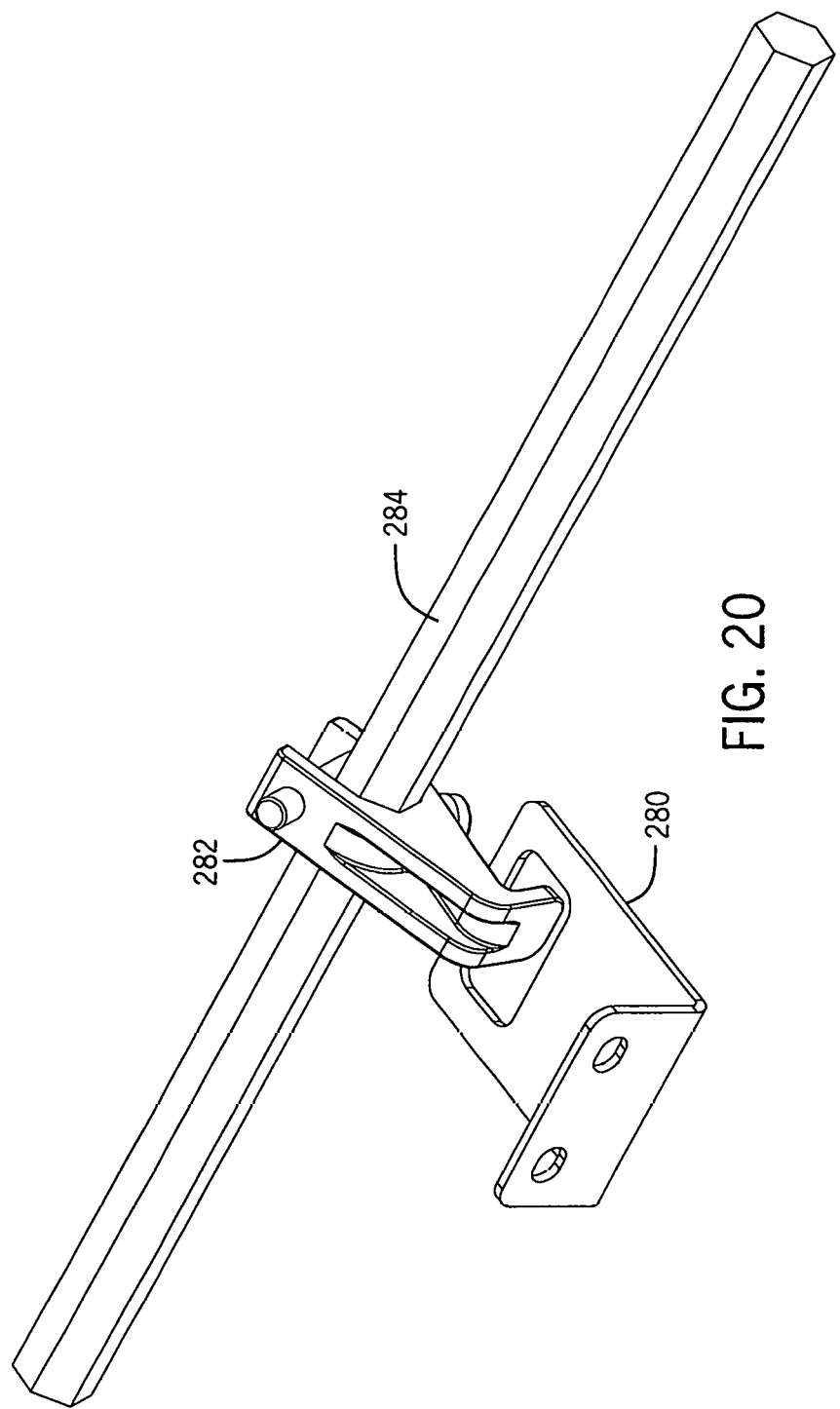
FIG. 20 is an isometric view of a latching device and a rotatable rod, according to an embodiment of the invention.

In some embodiments, an interlock can include other latching devices. For example, as illustrated in FIG. 20, a latch bracket 280 can be secured to a door (not shown) in general alignment with a latch member configured as a latching cam 282. Further, the latching cam 282 is secured to a rotatable rod 284 of a rotatable arrangement of an interlock. Accordingly, when the rotatable rod 284 is rotated in a first direction (e.g., due to operation of a PDA (not shown)) the latching cam 282 can be moved out of engagement with the latch bracket 280, to unlatch the relevant door.

Likewise, when the rotatable rod 284 is rotated in a second direction, the latching cam 282 can be moved into engagement with the latch bracket 280, to latch the relevant door.

As also noted above, some embodiments of the invention can include a power interlock mechanism for a power disconnect. For example, a power interlock mechanism according to some embodiments can be configured to inter-operate with a rotatable rod arrangement and a door activator (e.g., a PDA) in order to prevent a door (e.g., a primary door) from opening unless a power disconnect has been used to de-energize the relevant enclosure.

Figure 21:
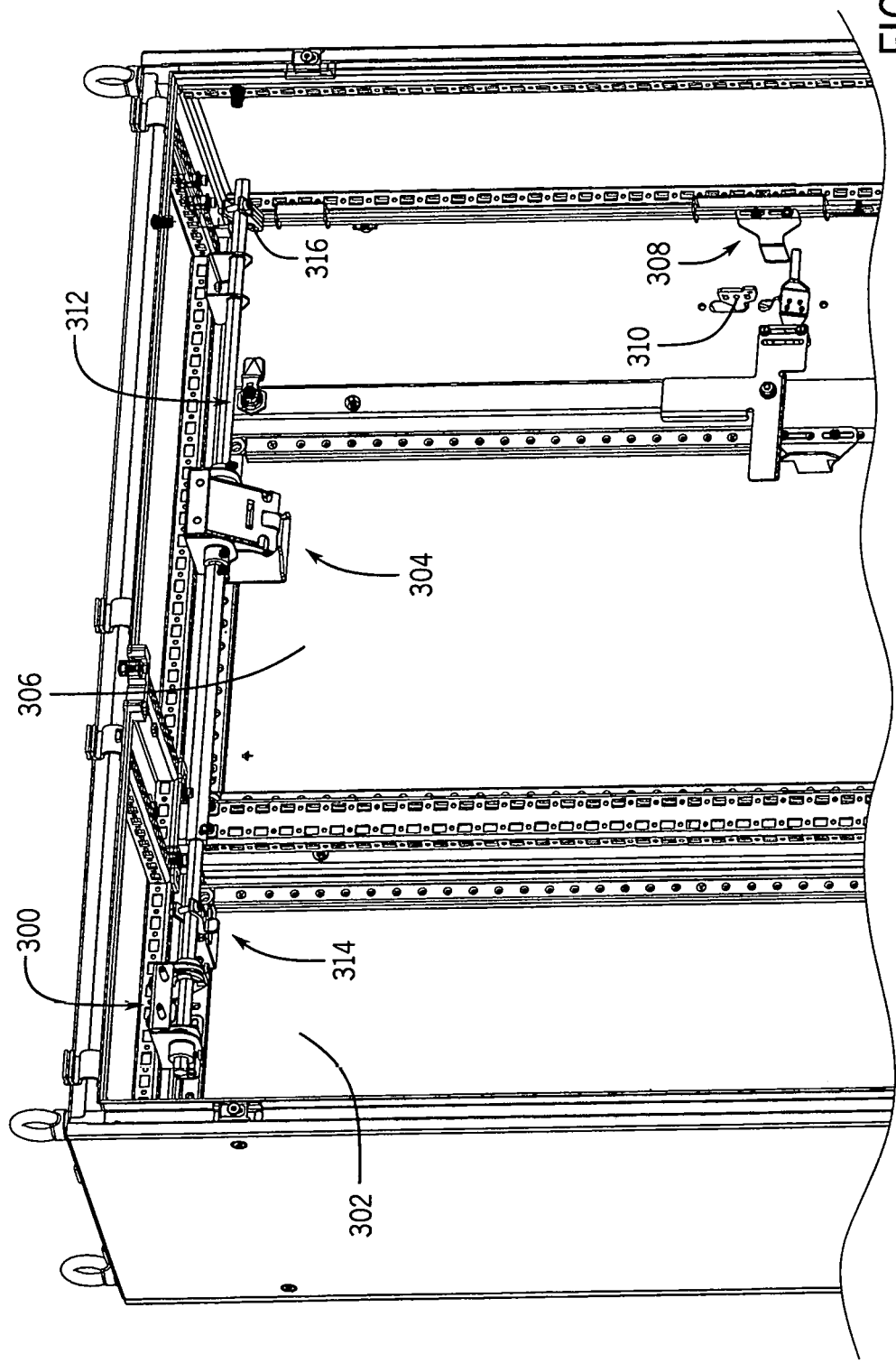
FIG. 21 is an isometric view of certain internal components of an enclosure, including an interlock according to an embodiment of the invention, with primary and secondary interlock activators, a power disconnect, and an interlock mechanism for the power disconnect.

FIG. 21 illustrates an example interlock according to the invention, which includes an SDA 300 for a secondary door 302, a PDA 304 for a primary door 306, a power interlock mechanism 308 configured to operate with a power disconnect 310 (only partially shown in FIG. 21), and a rotatable rod arrangement 312 that links the SDA 300, the PDA 304, and the power interlock mechanism 308. As also described below, if the power disconnect 310 is disposed so that the enclosure is energized, the PDA 304, the rod arrangement 312, and the power interlock mechanism 308 generally cooperate to prevent the primary door 306 from being opened.

As similarly discussed above, when the primary door 306 cannot be opened, the PDA 304, via the rod arrangement 312, ensures that the latching device 314 (e.g., configured similarly to the latching cam 282 of FIG. 20) remains engaged and thereby prevents the secondary door 302 from being opened. However, when the power disconnect 310 is disposed so that the enclosure is de-energized, the power interlock mechanism 308 can permit the primary door 306—and thereby also the secondary door 302—to be opened. Further, when the power disconnect 310 is disposed so that the enclosure is de-energized, the power interlock mechanism 308 can prevent operation of the power disconnect 310 to re-energized until the primary door 306 (and, per operation of the interlock generally, also the secondary door 302) has been closed.

Figure 22:
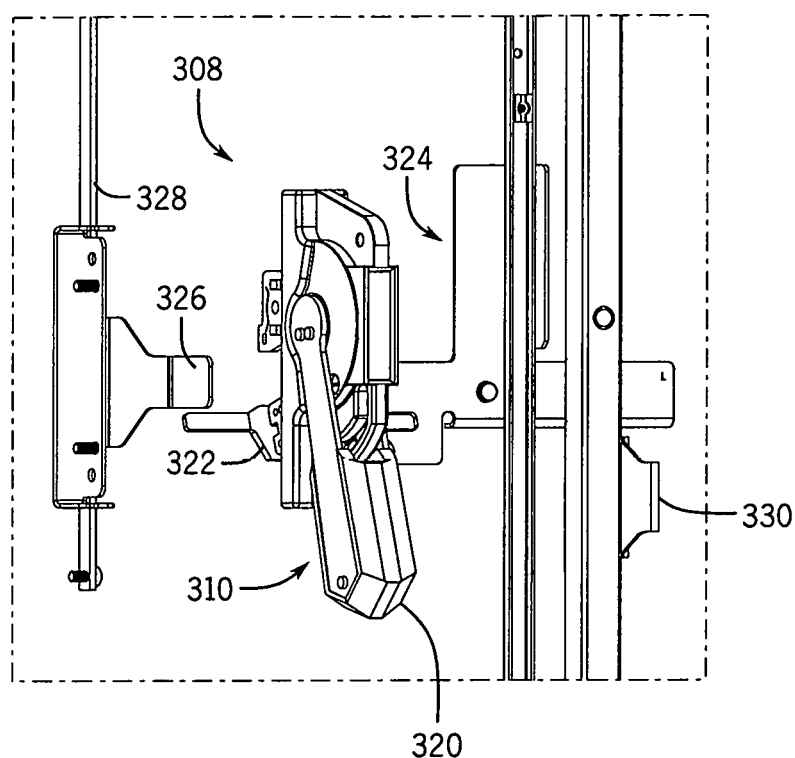
FIGS. 22 and 23 are enlarged isometric partial views, from front and rear perspectives, of the power disconnect and the interlock mechanism of FIG. 21.
Figure 23:
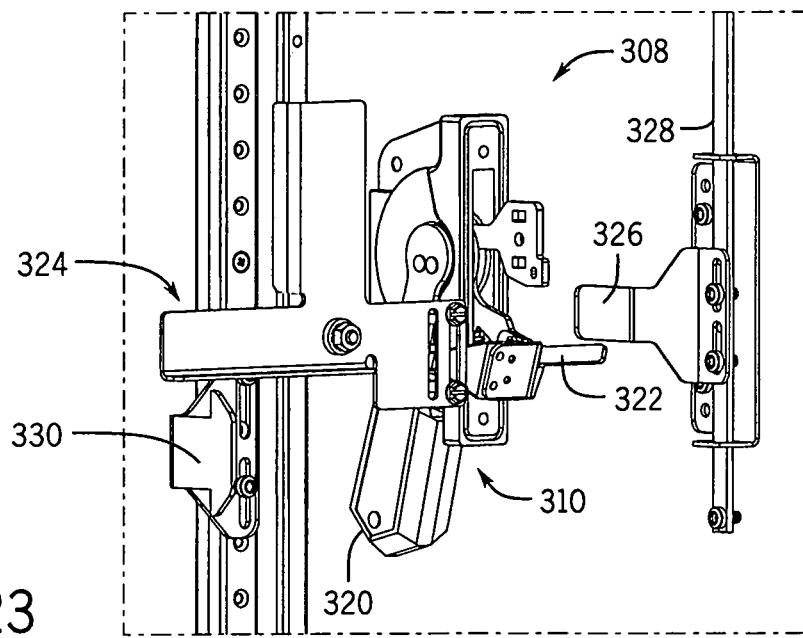

FIGS. 22 and 23 illustrate certain details of the power interlock mechanism 308 with regard to this functionality. In the embodiment illustrated, for example, the power disconnect 310 includes a handle 320 that is configured to pivot upwards (not shown) to energize the enclosure, and to pivot downwards (as illustrated) to de-energize the enclosure. Pivoting the handle 320 upwards generally causes an upwardly-biased latch actuator 322 to also pivot upwards. This, in turn, generally causes an opposing end of a latch member 324 that is engaged with the latch actuator 322 to pivot downwards.

However, if upward movement of the latch actuator 322 is not blocked after a relatively small amount of travel, an internal catch (not shown) of the power disconnect 310 generally prevents the handle 320 from finishing its upward movement. In this way, for example, failure to block the upward movement of the latch actuator 322 can prevent the power disconnect 310 from energizing the enclosure.

In the embodiment illustrated, a disconnect stop 326 that extends away from an elongate interlock member 328 is configured to control whether upward movement of the latch actuator 322 is blocked, and therefore over whether the enclosure can be energized. In particular, as illustrated in FIG. 21, a cam bracket 316 couples an upper end of the interlock member 328 to the rotatable rod arrangement 312. Correspondingly, as the rotatable rod arrangement 312 is rotated (e.g., as permitted or caused by the SDA 300 and the PDA 304), the disconnect stop 326 can be translated upwardly or downwardly relative to the latch actuator 322 of the power disconnect 310 (see FIG. 22).

Thus arranged, the power interlock mechanism 308 can accordingly operate in a number of different ways. As one example, the power interlock mechanism 308 can prevent the primary door 306 (see FIG. 21) from being opened while the enclosure is energized. For example, due to the connection between the PDA 304, the primary door 306, and the rod arrangement 312, the primary door 306 being closed generally corresponds to the disconnect stop 326 having been moved, via the cam bracket 316 and the interlock member 328, to a lower position. Accordingly, as the primary door 306 starts to open, a corresponding initial rotation of an activator arm of the PDA 304 (e.g., similar to the activator arm 118 of FIGS. 2A through 3) results in a rotation of the rod arrangement 312 that starts to move the disconnect stop 326 upward. Simultaneously, the upward bias of the latch actuator 322 allows the latch actuator 322 to also move upward, in conjunction with the disconnect stop 326.

As long as the power disconnect 310 is in the upward orientation (not shown) to energize the enclosure, this upward movement of the latch actuator 322 results in the latch member 324 being pivotally urged into engagement with a catch 330 for the door 306. Accordingly, any attempt to open the primary door 306 while the enclosure is energized can be prevented by the latch member 324. In contrast, when the power disconnect is in the downward orientation (as shown), upward movement of the disconnect stop 326, such as may be caused by the PDA 304 as the primary door 306 is opened, does not result in the latch actuator 322 moving upward in the same way. Accordingly, the latch actuator 322 does not pivot the latch member 324 into engagement with the catch 330, and the primary door 306 can be opened.

As another example, the power interlock mechanism 308 can also prevent the enclosure from being energized when the primary door 306 is open. For example, also due to the connection between the PDA 304, the primary door 306, and the rod arrangement 312, the primary door 306 being open generally corresponds to the disconnect stop 326 having been moved, via the cam bracket 316 and the interlock member 328, to an upper position. Accordingly, the disconnect stop 326 is not disposed to block upward movement the latch actuator 322 when the handle 320 of the power disconnect 310 is pivoted upward.

However, as also described above, the handle 320 cannot be moved to the energized position unless the upward movement of the latch actuator 322 is blocked. Therefore, the disposition of the disconnect stop 326 at the upper position (i.e., due to the door 306 being open) prevents the enclosure from being energized. In contrast, when the primary door 306 is closed, engagement of the primary door 306 with the PDA 304 can cause the disconnect stop 326 to be moved to a lower position. As also described above, the disconnect stop 326 can then block upward movement of the latch actuator 322 and thereby allow the enclosure to be energized.

Figure 24:
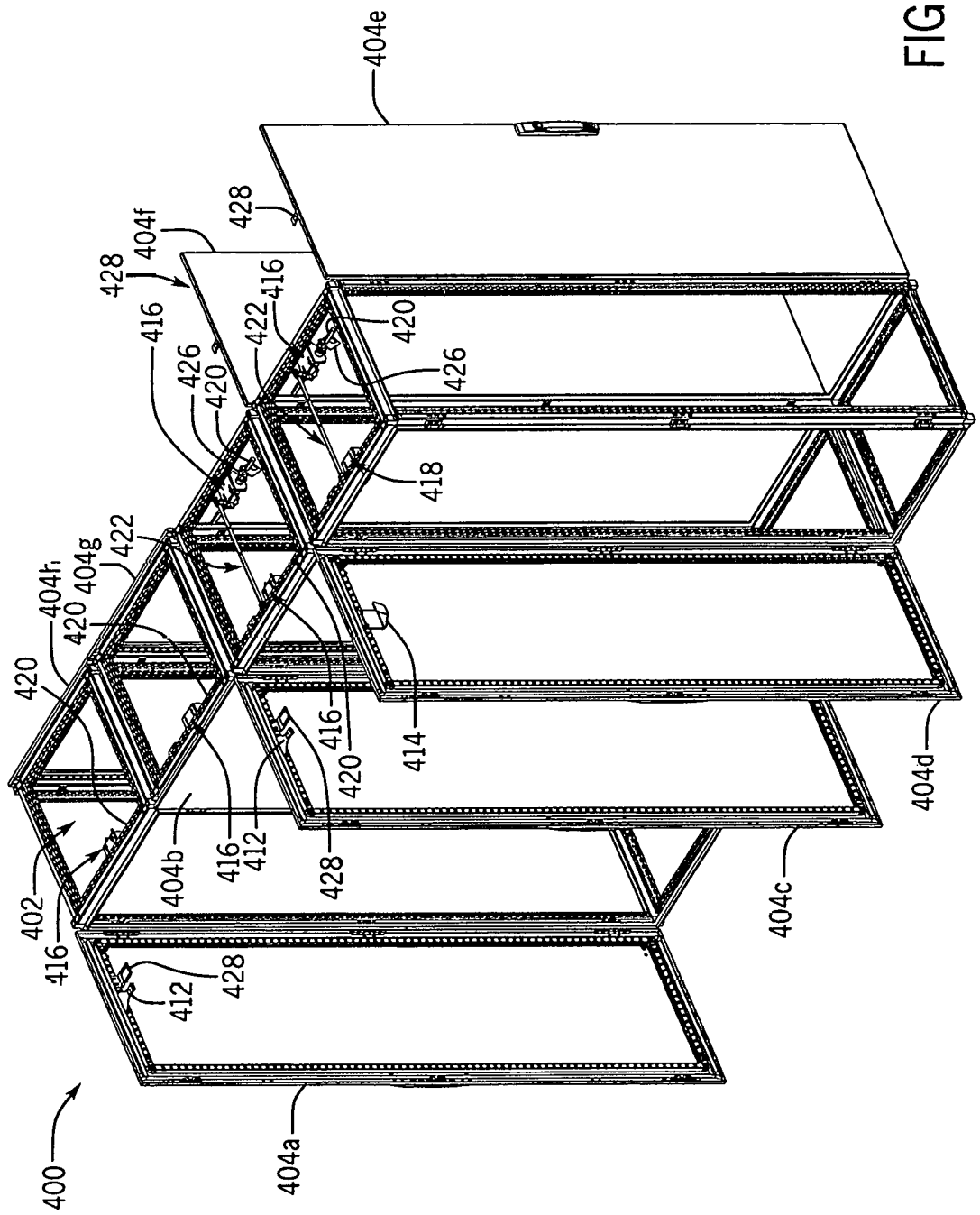
FIG. 24 is an isometric view of a multi-door enclosure for use with an interlock according to an embodiment of the invention.
Figure 25:
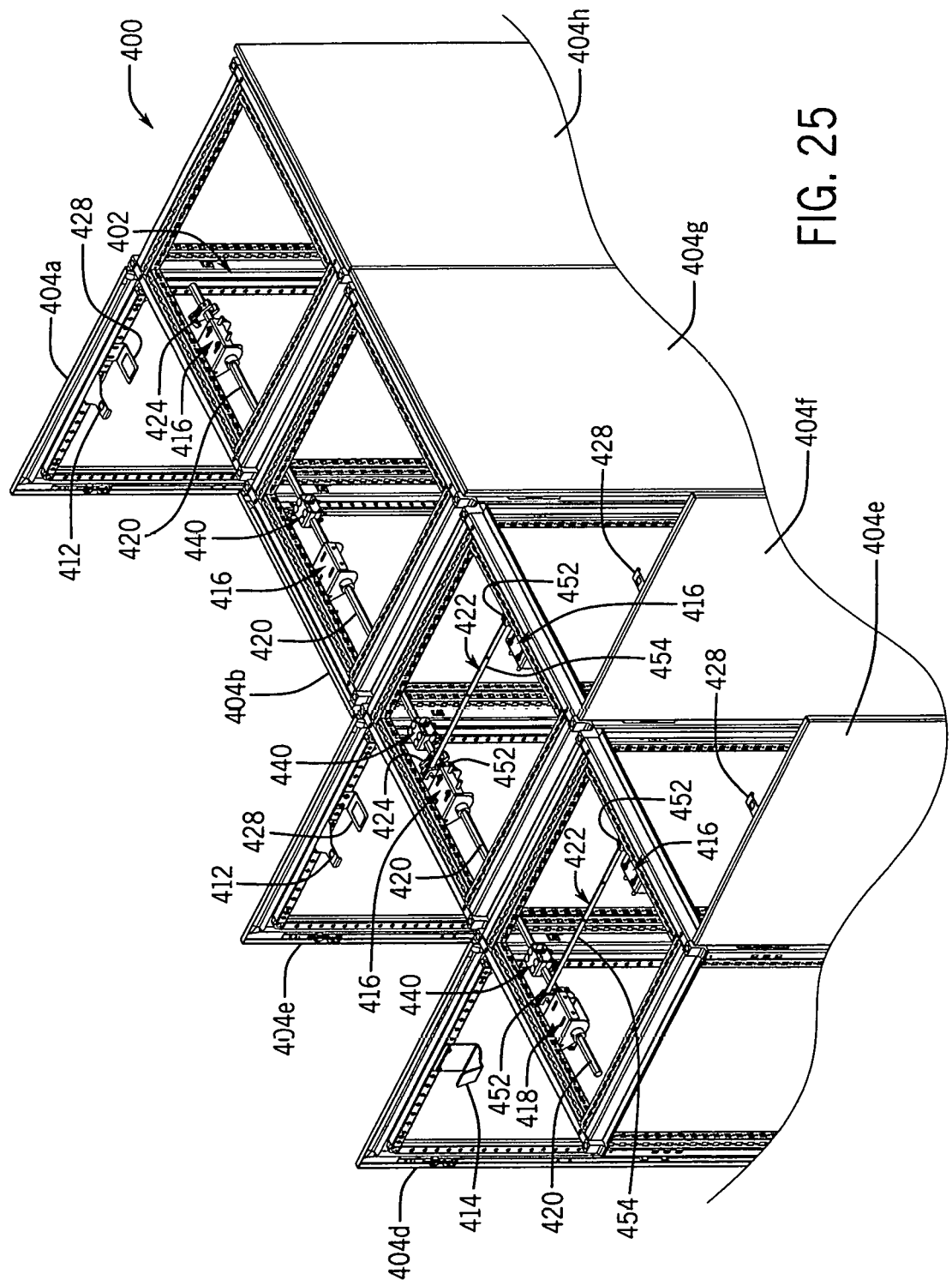
FIG. 25 is an isometric partial view of the multi-door enclosure of FIG. 24, from an opposite side of the enclosure.

FIGS. 24 and 25 illustrate another enclosure 400 that is equipped with an interlock 402 according to an embodiment of the invention. The enclosure 400 includes four bays, with doors 404a through 404h allowing access to each bay from the front or the rear of the enclosure 400. In some embodiments, the bays may be separated internally (not shown) with different bays being energized at different voltages. In some embodiments, one or more of the doors 404a through 404h may be configured as a main power disconnect door.

To control access to the respective bays from the respective side of the enclosure 400, each of the doors 404a, 404b, 404c, 404e, 404f is equipped with an SDA 416 and the door 404d is equipped with a PDA 418. In some cases, doors not leading to energized bays, or energized sub-divisions of bays, such as the doors 404g, 404h, may not be included in an interlock arrangement.

Generally, the SDA 416 and the PDA 418 are configured, and function, similarly to the SDAs 150 and the PDA 110 (see, e.g., FIGS. 2A through 11) to provide interlock functionality to the enclosure 400. For example, in the embodiment illustrated, an arrangement of hexagonal rods 420 interlinks the PDA 418 and the SDAs 416, including via cross-enclosure cam assemblies 422. Further, the hexagonal rods 420 support latching cams 424, 426 that are configured to engage or disengage associated latch brackets 428 secured to the doors 404a through 404f. Accordingly, under similar principles as discussed in detail above, the SDAs 416m the PDA 418, and interlock stops 412, 414 can prevent the doors 404a, 404b, 404c, 404e, 404f from being opened unless the door 404d has been already opened, and can prevent the door 404d from being closed unless each of the doors 404a, 404b, 404c, 404e, 404f has been already closed.

In other embodiments, other combinations of the doors 404a through 404h can include PDAs or SDAs in various configurations. For example, in some configurations, instances of the SDAs 416 can be included on each of the doors 404g, 404h.

Figure 26:
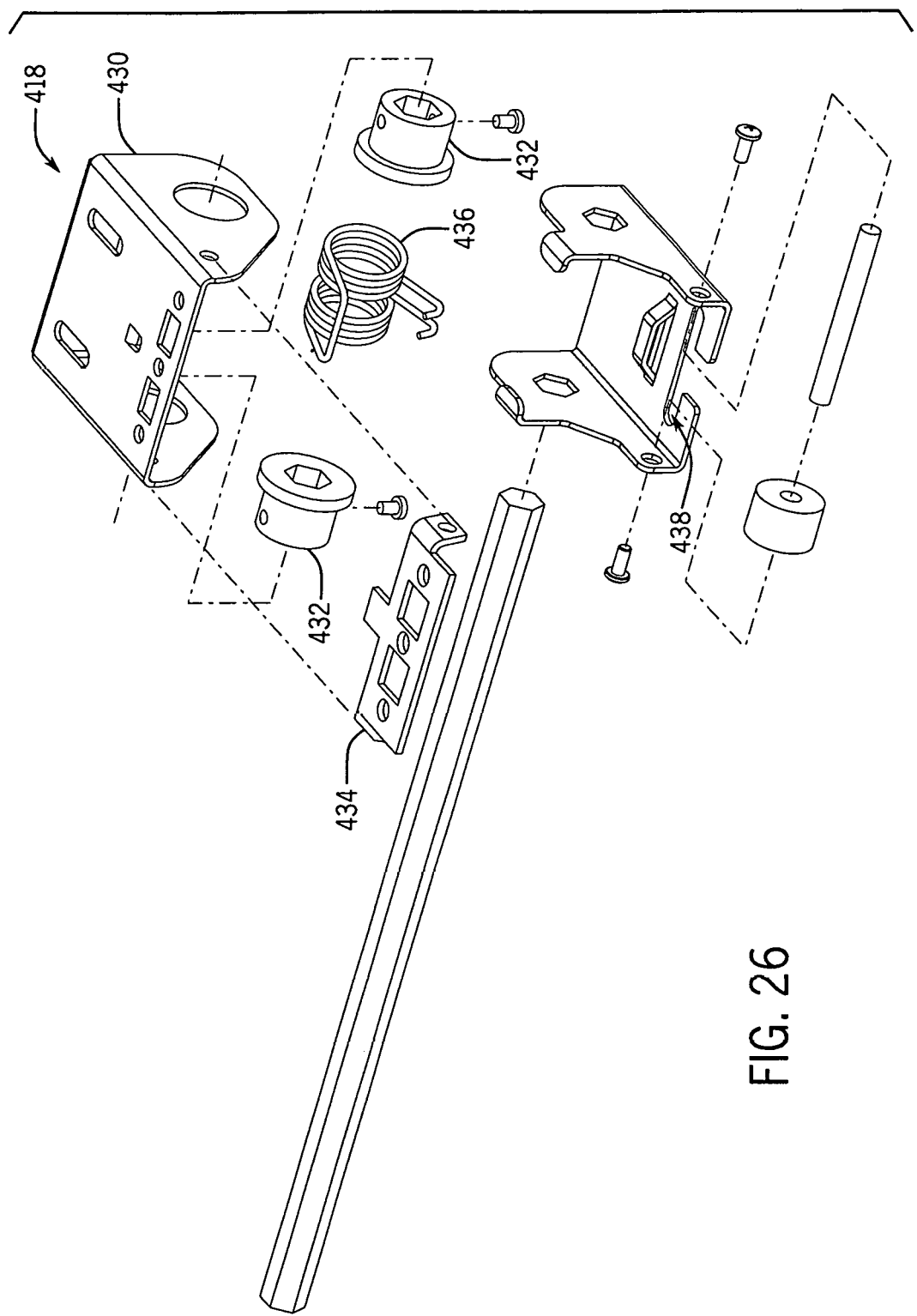
FIG. 26 is an exploded isometric view of a primary interlock activator of the interlock of FIG. 24.

Although the PDA 418 is generally similar to the PDA 110 (see, e.g., FIG. 3), some aspects the PDA 418 are configured somewhat differently from the PDA 110. For example, as illustrated in FIG. 26, the PDA 418 includes a chassis 430 similar to the chassis 112 of the PDA 110, which supports a pair of hex-rod bushings 432 similar to the bushings 116. In contrast to the bushings 116, however, the bushings 432 are configured to directly receive one of the rods 420, rather than a sleeve to hold a rod.

As another example, a mounting bracket 434 is configured to be riveted (or otherwise secured) to the chassis 430. This can be useful, for example, in order to facilitate relatively secure attachment of a biasing component, such as a coil spring 436 to the chassis 430. Likewise, a T-shaped cut-out 438 on the PDA 418 can allow access for users to easily insert a screwdriver or similar tool to secure the chassis 430 to the enclosure 400.

Figure 27B:
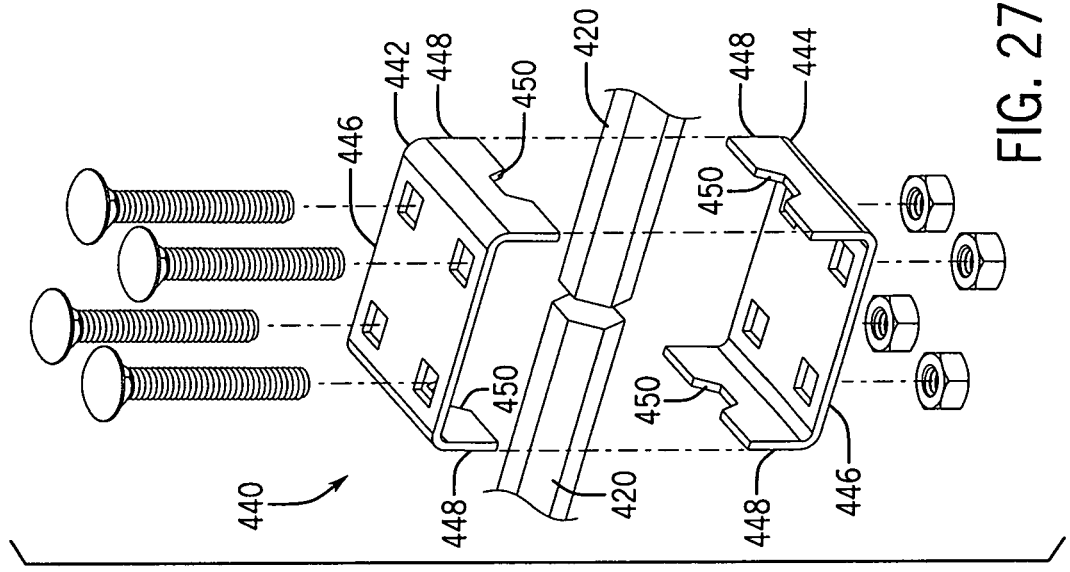
FIGS. 27A and 27B are isometric and exploded isometric views of a coupler arrangement of the interlock of FIG. 24.
Figure 27A:
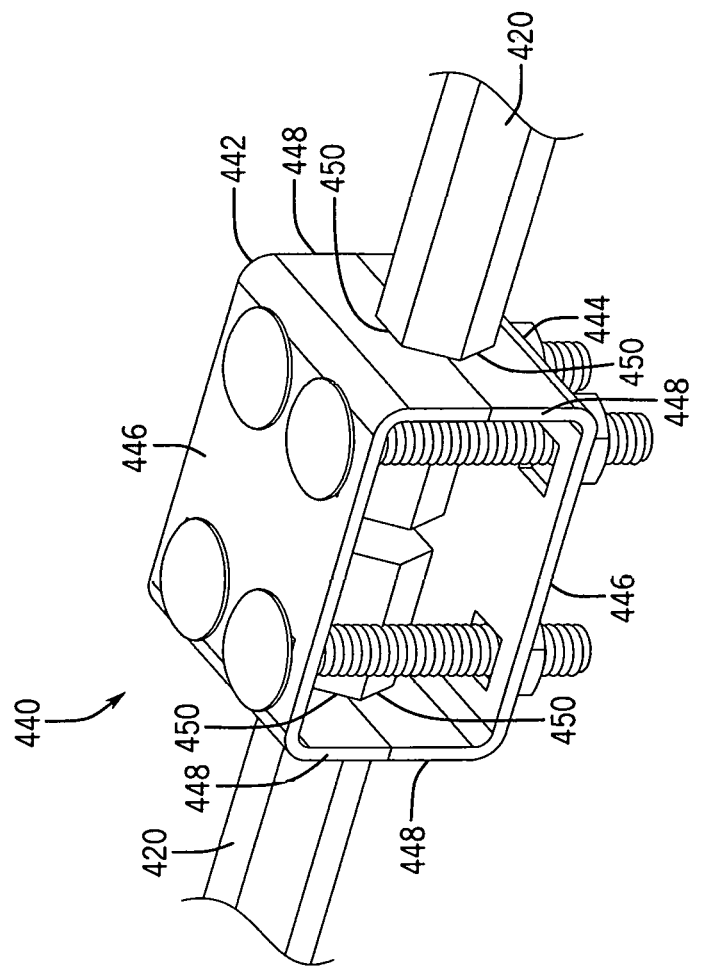

Other aspects of the interlock 402 can also vary from those of interlocks illustrated in preceding figures or otherwise presented above. For example, the rods 420 of the interlock 402 are generally secured together using a multi-piece coupler 440, as illustrated in FIGS. 27A and 27B. The coupler 440 is formed from a set of symmetrically-shaped, integrally formed brackets 442, 444, each of which includes a respective securement portion 446 configured as a planar link, and a respective set of rod-engagement legs 448 formed as planar extensions from the opposing ends of the securement portions 446.

To secure the ends of adjacent hexagonal rods 420, each of the legs 448 includes a half-hexagon cut-out 450 and each of the securement portions 446 includes an array of square bolt holes. The ends of the rods 420 can be aligned with the cut-outs 450 and the brackets 442, 444 can then be secured together, such as with square-necked bolts (as shown), in order to ensure that the rods 420 generally rotate simultaneously with each other.

In other embodiments, other configurations are possible. For example, other types of cut-outs can be provide to accommodate other rod profiles, or other types or arrangements of fasteners can be used to secure a coupler around a set of rod ends. In some embodiments, other types of couplers, such as a sleeve coupler (see, e.g., FIG. 21) can be used.

As also noted above, the interlock 402 is configured to transmit rotation between instances of the rods 420 on opposite sides of the enclosure 400 via the cross-enclosure cam assemblies 422. Generally, the cam assemblies 422 are configured similarly to the arrangement illustrated in FIG. 17, with cam brackets 452 connected by linking bars 454 to cause instances of the rods 420 on opposite sides of the enclosure 400 to rotate in opposite directions.

Figure 28:
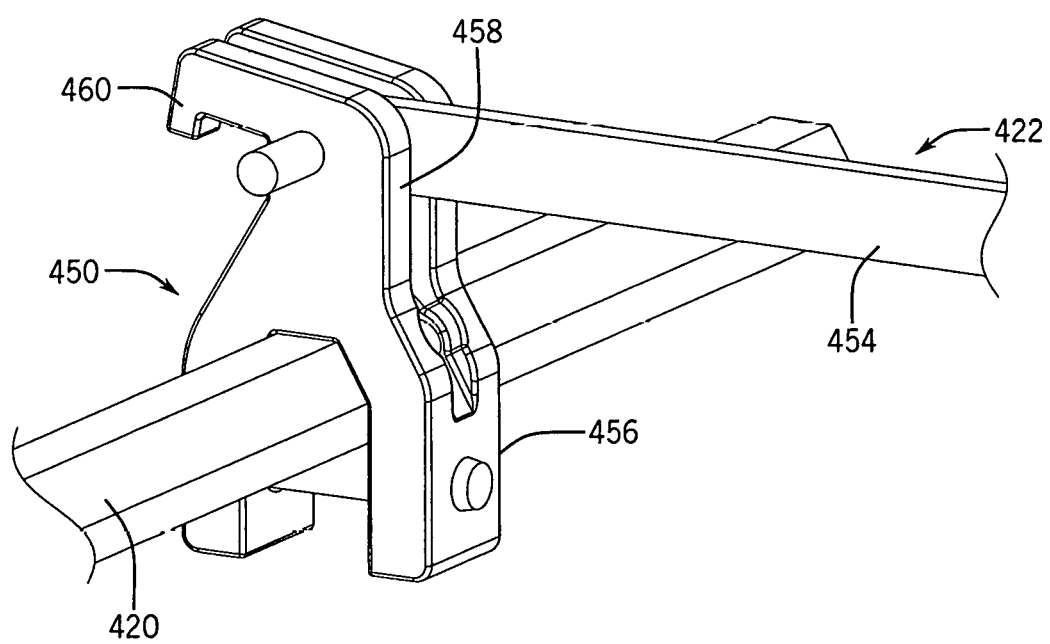
FIG. 28 is an isometric partial view of a cam assembly of the interlock of FIG. 24.

In different embodiments, different configurations are possible for cam brackets. In the embodiment illustrated, as shown in FIG. 28 in particular, the cam brackets 452 include a yoke 456 to engage the rods 420, and a neck 458 configured for pinned attachment to one of the linking bars 454. Further, the cam brackets 452 include a hooked end 460, so that the cam brackets 452 can be used as parts of the cam assemblies 422 or as latching cams, as appropriate.

Figure 29A:
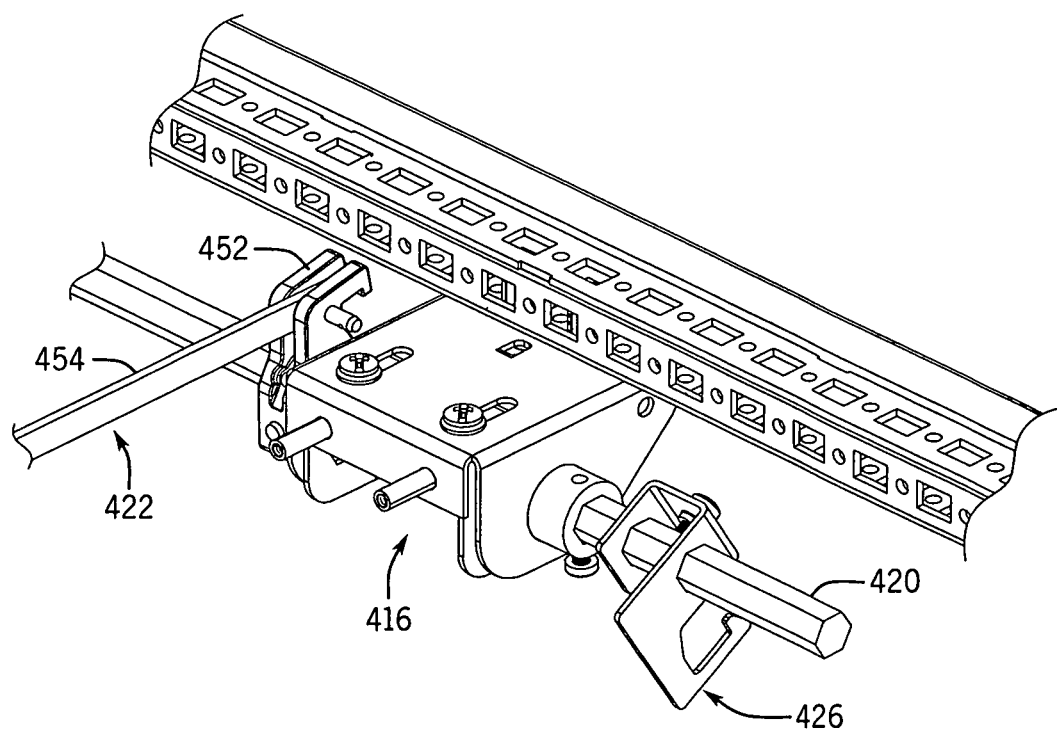
FIG. 29A is an isometric partial view of a latching assembly of the interlock of FIG. 24.
Figure 29B:
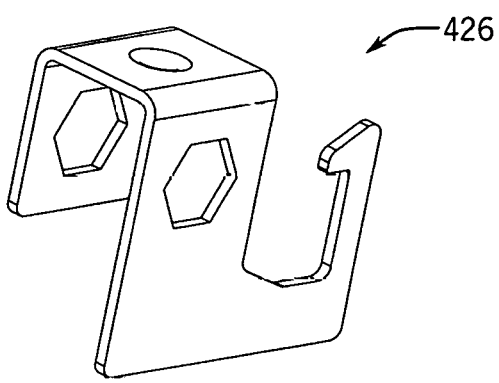
FIG. 29B is an isometric view of a latch member of the latching assembly of FIG. 29A.

In some embodiments, latching arrangements on one side of an enclosure may be configured differently than latching arrangements on primary and secondary sides of the enclosure. As illustrated in FIGS. 29A and 29B, for example, the latching cams 426 on a secondary side of the enclosure 400 (i.e., to the back, from the perspective of FIG. 24) can be formed as upwardly hooked latching cams. In contrast, the latching cams 424 on a primary side of the enclosure 400 (i.e., to the front, from the perspective of FIG. 24) can be configured to hook downwardly. Accordingly, downward rotation of the primary-side latching cams 424 to latch the doors 404a, 404b, 404c, 404d, as transmitted via the cam assemblies 422, can correspond to simultaneous upward rotation of the secondary-side latching cams 426 to latch the doors 404e, 404f.

Latching cams can configured in a variety of ways. For example, some latching cams can be formed as cast, machined, or additive manufacturing components similar to the cam brackets 452. Likewise, other latching cams can be formed (e.g., stamped) from single pieces of sheet metal or other material, such as illustrated for the latching cam 426 in FIG. 29B.

In the embodiment illustrated in FIGS. 24 and 25, interoperation of the interlock 402 and a power disconnect (not shown) may be different from that of the power disconnect arrangement discussed with regard to FIGS. 21 through 23. For example, in the enclosure 400, a latch member (not shown) similar to the latch member 324 (see, e.g., FIG. 22) and an associated power interlock mechanism (not shown) may be configured to interoperate somewhat independently of the rotatable rods 420, to ensure that the primary door 404d cannot be opened when the enclosure 400 is energized.

Further, in place of other power interlock mechanisms discussed herein, the PDA 418 and SDAs 416 can interoperate to ensure that a power-disconnect door cannot be closed, to re-energize the enclosure 400, unless each other relevant door has been closed already. For example, with the door 404d as a power-disconnect door, the PDA 418 can operate as generally described above to ensure that the door 404d cannot be closed until each of the doors 404a, 404b, 404c, 404e, 404f has also been closed.

In other embodiments, other configurations are possible. For example, some configurations may include an SDA, such as one of the SDAs 416, on a power-disconnect door.

Generally, the particular configurations presented expressly above of PDAs, SDAs, and associated enclosures and interlocks should be considered as examples only. In other embodiments, other configurations are possible. For example, through the use of appropriately configured rod arrangements, PDAs, and SDAs, any number of door activators can be arranged at any number of locations on an enclosure. Accordingly, for example, it may be possible to dispose a PDA on either side of a power disconnect, to dispose one or more SDAs on either side of a PDA, or to dispose one or more SDAs on opposite sides of an enclosure. Similarly, in different embodiments, different arrangements for converting or transmitting rotational movement of a rotatable (e.g., rod) arrangement can be used, including rack and gear arrangements, coupler and rod arrangements, cam arrangements, and so on. Further, due to the relatively simple mechanical transmission of interlock forces (e.g., through extended rotatable rod arrangements), interlocks according to the invention can be implemented in enclosures with a wide variety of internal configurations, including enclosures with barriers between enclosure bays, or with other structures through mechanical motion can be transmitted (e.g., by physical passage of a rotatable rod).

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. An interlock for controlling doors on an enclosure, the enclosure including a primary door and a secondary door, the interlock comprising:
   a primary door activator that includes a rotatable arm that is configured to rotate between an open configuration and a closed configuration;
   a rotatable rod assembly connected to, and configured to rotate with, the rotatable arm;
   a secondary door activator that includes a jaw that is configured to move between an open configuration and a closed configuration;
   the rotatable arm:
      when in the open configuration, being disposed to prevent the primary door from closing; and
      when in the closed configuration, being disposed to allow the primary door to close;
   the jaw:
      when in the open configuration, being disposed to engage the rotatable rod assembly to prevent rotation of the rotatable rod assembly and the rotatable arm; and
      when in the closed configuration, being disposed to permit rotation of the rotatable rod assembly and the rotatable arm; and
   the jaw being disposed to be moved by the secondary door, from the closed configuration to the open configuration, when the secondary door is closed.

2. The interlock of claim 1, wherein each of the jaw and the rotatable arm is biased towards the respective open configuration.

3. The interlock of claim 1, further comprising:
   a primary latch member; and
   a secondary latch member;
   wherein the primary latch member is secured to the rotatable rod assembly to rotate with the rotatable rod assembly, in order to latch and unlatch the primary door; and
   wherein the secondary latch member is secured to the rotatable rod assembly to rotate with the rotatable rod assembly, in order to latch and unlatch the secondary door.

4. An interlock for an enclosure, the enclosure including a primary door and a secondary door, the interlock comprising:
   a primary door activator with an activator arm, the activator arm blocking the primary door from being closed when the activator arm is in an open configuration;
   a secondary door activator; and
   a rotatable arrangement that connects the primary door activator to the secondary door activator;
   the activator arm being configured to rotate with the rotatable arrangement in a first direction towards the open configuration as the primary door is opened, and in a second direction away from the open configuration as the primary door is closed;
   the secondary door activator being configured:
      to engage the rotatable arrangement to prevent rotation of the rotatable arrangement when the secondary door is open; and
      to permit rotation of the rotatable arrangement when the secondary door is closed.

5. The interlock of claim 4, further comprising:
   a primary interlock stop secured to the primary door, the primary interlock stop being configured to urge the activator arm to rotate away from the open configuration as the primary door is closed.

6. The interlock of claim 4, wherein the activator arm is biased towards the open configuration.

7. The interlock of claim 4, wherein a jaw of the secondary door activator is configured to translate relative to a chassis of the secondary door activator, as the secondary door is opened, to engage the rotatable arrangement.

8. The interlock of claim 7, wherein translation of the jaw relative to the chassis is guided by one or more of:
   a guide rod extending from the jaw through the chassis; and
   a slot on the chassis.

9. The interlock of claim 7, further comprising:
   a secondary interlock stop secured to the secondary door, the secondary interlock stop being configured to urge the jaw to translate out of engagement with the rotatable arrangement as the secondary door is closed.

10. The interlock of claim 7, wherein the jaw is biased towards engagement with the rotatable arrangement.

11. The interlock of claim 10, wherein translation of the jaw relative to the chassis is guided by a guide rod that extends from the jaw through the chassis; and
    wherein the jaw is biased towards engagement with the rotatable arrangement by a biasing member disposed on the guide rod.

12. The interlock of claim 4, with the enclosure including a plurality of secondary doors, wherein the secondary door activator is part of a plurality of secondary door activators, each being associated with a respective one of the secondary doors and including a jaw configured to:
    engage the rotatable arrangement to prevent rotation of the rotatable arrangement when the respective secondary door is open; and
    permit rotation of the rotatable arrangement when the respective secondary door is closed.

13. The interlock of claim 4, wherein the rotatable arrangement extends through an internal divider of the enclosure.

14. The interlock of claim 4, wherein the rotatable arrangement includes one or more hexagonal rods that are configured to rotate with the activator arm and be selectively engaged by a jaw of the secondary door activator.

15. An enclosure for electrical components, the enclosure comprising:
 a primary door for access to an interior of the enclosure;
 a secondary door for access to the interior of the enclosure;
 a primary door activator with an activator arm, the activator arm being rotatable between an open configuration, in which the activator arm blocks the primary door from being closed, and a closed configuration, in which the activator arm permits the primary door to be closed;
 a secondary door activator with a jaw; and
 a rotatable arrangement that connects the primary door activator and the secondary door activator;
 the jaw being biased toward engagement with the rotatable arrangement; and
 the rotatable arrangement being configured to rotate with the activator arm and to be prevented from rotating when engaged by the jaw.

16. The enclosure of claim 15, further comprising:
 a primary interlock stop secured to the primary door; and
 a secondary interlock stop secured to the secondary door;
 wherein the primary interlock stop extends away from the primary door towards the interior of the enclosure to:
  urge the activator arm to rotate away from the open configuration as the primary door is closed; and
  block the primary door from being closed while the activator arm is in the open configuration; and
 wherein the secondary interlock stop extends away from the secondary door towards the interior of the enclosure, to urge the jaw out of engagement with the rotatable arrangement as the secondary door is closed.

17. The enclosure of claim 15, wherein the secondary door activator is a first secondary door activator and the secondary door is a first secondary door;
 wherein the primary door activator and the first secondary door activator are disposed on a first side of the enclosure; and
 wherein a second secondary door activator is disposed on a second side of the enclosure opposite the first side, proximate a second secondary door.

18. The enclosure of claim 17, wherein the rotatable arrangement includes a first rod assembly on the first side of the enclosure and a second rod assembly on the second side of the enclosure; and
 wherein a cam assembly transmits rotation between the first rod assembly and the second rod assembly.

19. The enclosure of claim 17, further comprising:
 a first latch member for one of the primary door or the first secondary door,
 wherein the first latch member is configured to be rotated opened by rotation of the rotatable arrangement in a first direction and to be rotated closed by rotation of the rotatable arrangement in a second direction opposite the first direction.

20. The enclosure of claim 19, further comprising:
 a second latch member for the second secondary door,
 wherein the second latch member is configured to rotated by rotation of the rotatable arrangement, substantially simultaneously with the first latch member and in an opposite direction from the first latch member, to be opened or closed substantially simultaneously with the second latch member.

\* \* \* \* \*